United States Patent
Lee et al.

(10) Patent No.: US 11,800,769 B2
(45) Date of Patent: Oct. 24, 2023

(54) DISPLAY APPARATUS

(71) Applicant: Samsung Display Co., Ltd., Yongin-si (KR)

(72) Inventors: Dongha Lee, Yongin-si (KR); Wonhee Nam, Yongin-si (KR); Donghoon Kwak, Yongin-si (KR); Sukbeom You, Yongin-si (KR); Atsushi Kitabayashi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 269 days.

(21) Appl. No.: 17/148,433

(22) Filed: Jan. 13, 2021

(65) Prior Publication Data
US 2021/0335905 A1    Oct. 28, 2021

(30) Foreign Application Priority Data
Apr. 28, 2020    (KR) .................. 10-2020-0051828

(51) Int. Cl.
| | | |
|---|---|---|
| *H10K 59/35* | (2023.01) | |
| *H10K 59/38* | (2023.01) | |
| *H10K 59/122* | (2023.01) | |

(52) U.S. Cl.
CPC ......... *H10K 59/352* (2023.02); *H10K 59/122* (2023.02); *H10K 59/38* (2023.02)

(58) Field of Classification Search
CPC .............. H01L 27/3216; H01L 27/322; H01L 27/3246; H01L 27/3248; H01L 27/3258;
(Continued)

(56) References Cited

U.S. PATENT DOCUMENTS

| 8,454,113 B2 | 6/2013 | Paeng et al. |
| 9,082,732 B2 | 7/2015 | Goto |
| (Continued) | | |

FOREIGN PATENT DOCUMENTS

| CN | 105632394 | 6/2016 |
| CN | 105720074 | 6/2016 |
| (Continued) | | |

OTHER PUBLICATIONS

Extended European Search Report dated Sep. 21, 2021, in European Patent Application No. 21168566.4.
(Continued)

*Primary Examiner* — Anne M Hines
*Assistant Examiner* — Jose M Diaz
(74) *Attorney, Agent, or Firm* — H.C. Park & Associates, PLC

(57) ABSTRACT

An organic light-emitting display apparatus includes: a substrate; a $1\text{-}1^{st}$ pixel electrode in a $1\text{-}1^{st}$ pixel to emit light of a first wavelength range and a $1\text{-}2^{nd}$ pixel electrode in a $1\text{-}2^{nd}$ pixel to emit light of the first wavelength range. The $1\text{-}1^{st}$ pixel and the $1\text{-}2^{nd}$ pixel are over the substrate; a pixel-defining layer covering an edge of the $1\text{-}1^{st}$ pixel electrode and an edge of the $1\text{-}2^{nd}$ pixel electrode so as to define a $1\text{-}1^{st}$ exposed upper surface and a $1\text{-}2^{nd}$ exposed upper surface; a $1\text{-}1^{st}$ emission layer over the $1\text{-}1^{st}$ pixel electrode and to generate the light of the first wavelength range and a $1\text{-}2^{nd}$ emission layer over the $1\text{-}2^{nd}$ pixel electrode and to generate the light of the first wavelength range; and an opposite electrode over the $1\text{-}1^{st}$ emission layer and the $1\text{-}2^{nd}$ emission layer.

38 Claims, 10 Drawing Sheets

(58) Field of Classification Search
CPC ............. H01L 27/3262; H01L 27/3218; H01L 27/326
See application file for complete search history.

(56) References Cited

U.S. PATENT DOCUMENTS

| | | | |
|---|---|---|---|
| 10,707,273 B2 | 7/2020 | Madigan | |
| 2010/0053043 A1 | 3/2010 | Sakamoto | |
| 2014/0145586 A1 | 5/2014 | Choi | |
| 2021/0104589 A1* | 4/2021 | Shin | H01L 27/3258 |

FOREIGN PATENT DOCUMENTS

| | | |
|---|---|---|
| CN | 112053634 | 12/2020 |
| JP | 6079048 | 2/2017 |
| JP | 6102064 | 3/2017 |
| JP | 6142324 | 6/2017 |
| KR | 10-1637953 | 7/2016 |
| KR | 10-2019-0128088 | 11/2019 |

OTHER PUBLICATIONS

Conor F. Madigan et al., Advancements in Inkjet Printing for OLED Mass Production, SID 2014 Digest, p. 399-402.

Wu et al., "Development of 55 inch 4K AMOLED TV by Inkjet Printing Process", Institute of Microelectronics, Tsinghua University, pp. 236-238, Hefei BOE Joint Technology Co., Ltd., China.

\* cited by examiner

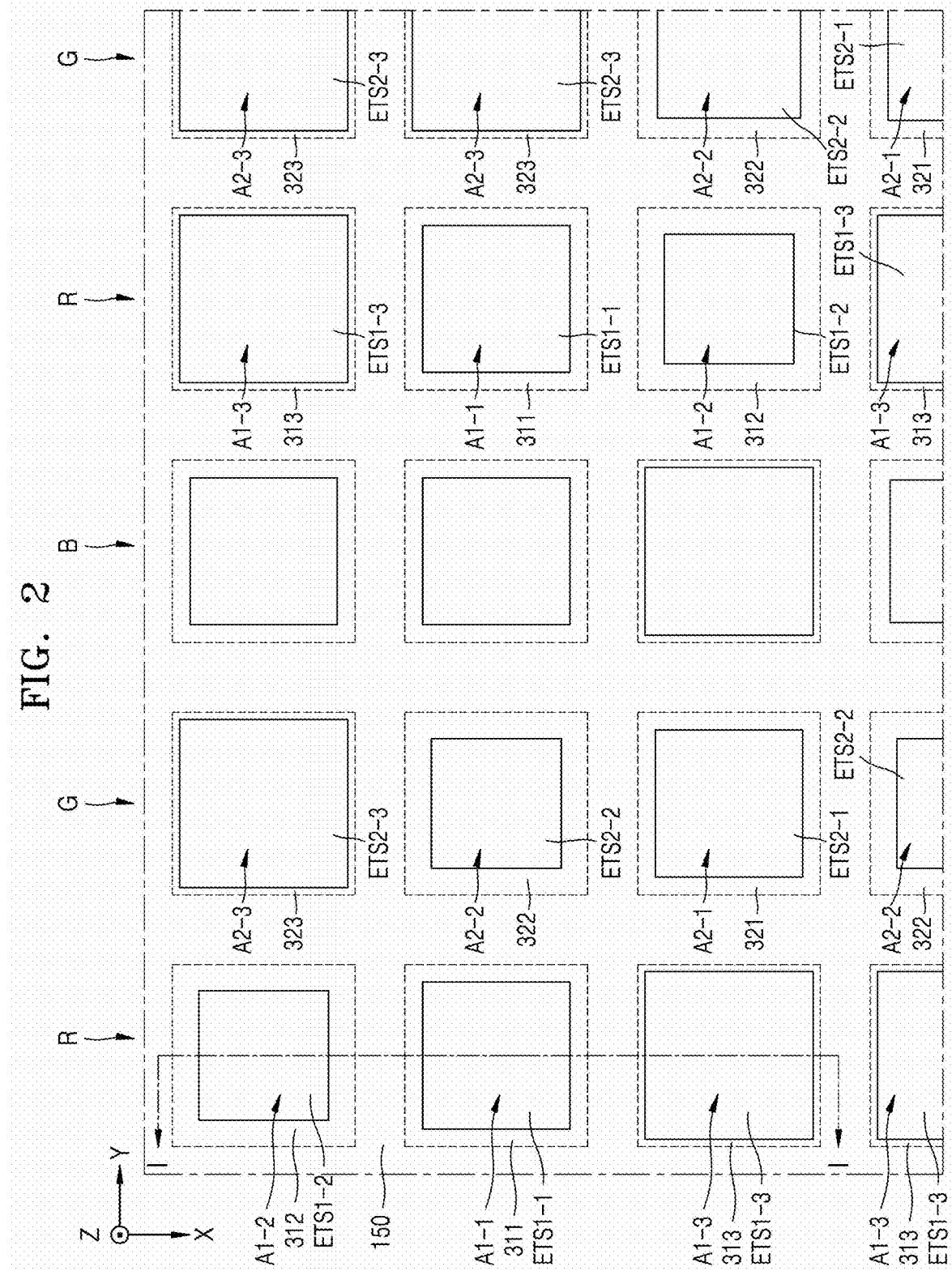

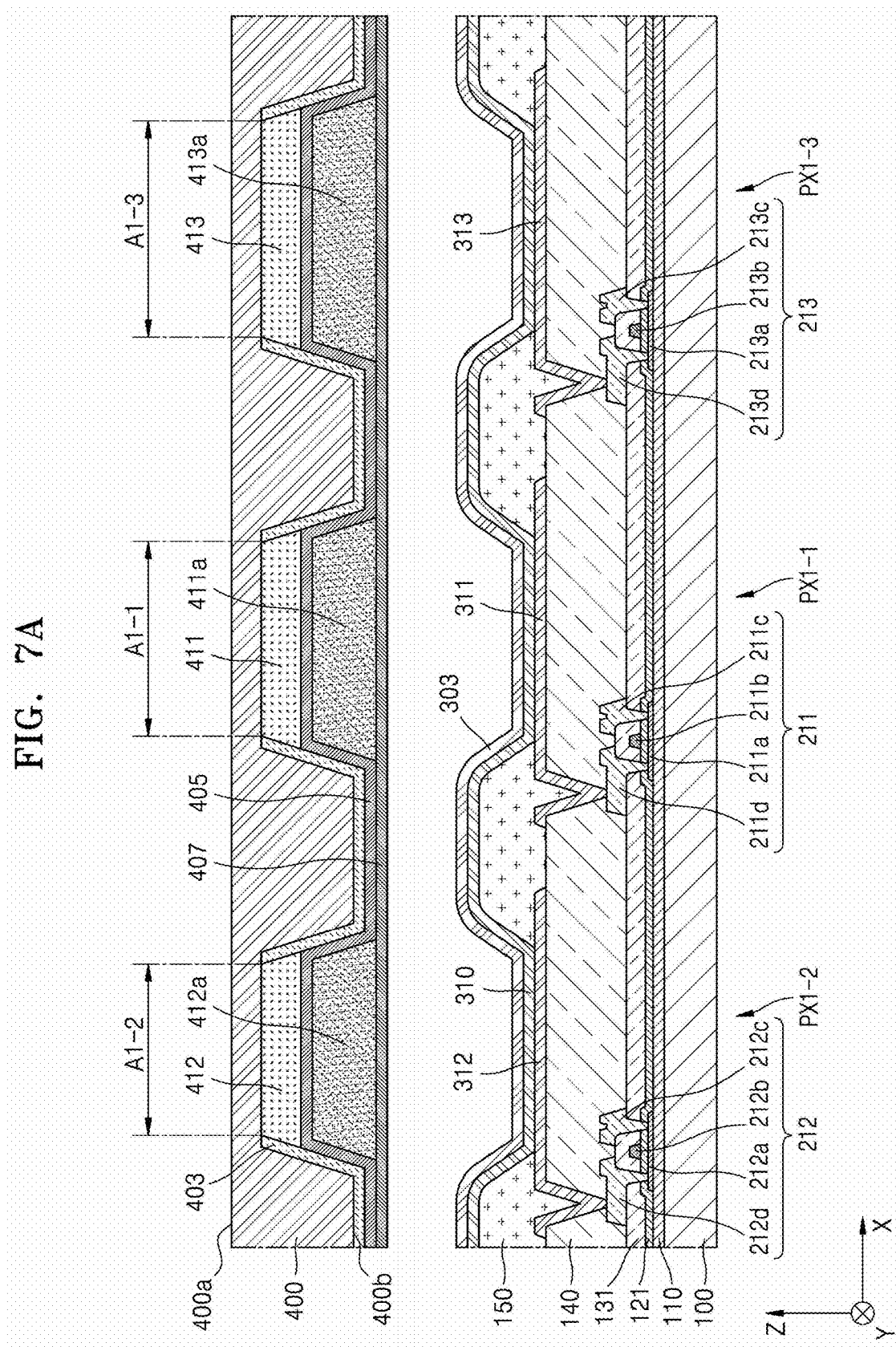

DISPLAY APPARATUS

CROSS-REFERENCE TO RELATED APPLICATION

This application claims priority from and the benefit of Korean Patent Application No. 10-2020-0051828, filed on Apr. 28, 2020, which is hereby incorporated by reference for all purposes as if fully set forth herein.

BACKGROUND

Field

Exemplary implementations of the invention relate generally to a display apparatus, and more particularly, to a display apparatus capable of displaying a high-quality image.

Discussion of the Background

A display apparatus has a display area, in which a plurality of pixels are disposed. For example, the plurality of pixels may include first color sub pixels, second color sub pixels, and third color sub pixels for emitting lights having different wavelengths and substantially same brightness according to electrical signals applied to the pixels.

In conventional display apparatus, when electrical signals to produce light of substantially the same brightness are applied to pixels to produce light in the substantially the same wavelength range, light of different brightness may be generated. This defect in brightness produces a phenomenon in which the vertical stripes are visible in the image shown to a user.

The above information disclosed in this Background section is only for understanding of the background of the inventive concepts, and, therefore, it may contain information that does not constitute prior art.

SUMMARY

Applicant discovered that conventional display devices having the defective vertical stripe phenomenon can be caused by a difference in thickness of emission layers in adjacent pixel columns.

Display devices constructed according to the principles and exemplary implementations of the invention can display a high-quality image by minimizing or preventing the vertical stripe phenomenon in the pixel columns. For example, the pixels may include exposed areas having sizes that are randomly distributed to prevent the vertical stripe phenomenon.

Additional features of the inventive concepts will be set forth in the description which follows, and in part will be apparent from the description, or may be learned by practice of the inventive concepts.

According to an aspect of the invention, an organic light-emitting display apparatus includes: a substrate; a $1\text{-}1^{st}$ pixel electrode disposed in a $1\text{-}1^{st}$ pixel to emit light of a wavelength belonging to a first wavelength range and a $1\text{-}2^{nd}$ pixel electrode disposed in a $1\text{-}2^{nd}$ pixel to emit light of a wavelength belonging to the first wavelength range, wherein the $1\text{-}1^{st}$ pixel and the $1\text{-}2^{nd}$ pixel are disposed over the substrate; a pixel-defining layer covering an edge of the $1\text{-}1^{st}$ pixel electrode and an edge of the $1\text{-}2^{nd}$ pixel electrode so as to define a $1\text{-}1^{st}$ exposed upper surface including a center of an upper surface of the $1\text{-}1^{st}$ pixel electrode and a $1\text{-}2^{nd}$ exposed upper surface including a center of an upper surface of the $1\text{-}2^{nd}$ pixel electrode such that the $1\text{-}1^{st}$ exposed upper surface has a $1\text{-}1^{st}$ area and the $1\text{-}2^{nd}$ exposed upper surface has a $1\text{-}2^{nd}$ area differing in size; a $1\text{-}1^{st}$ emission layer over the $1\text{-}1^{st}$ pixel electrode and to generate the light of the wavelength belonging to the first wavelength range and a $1\text{-}2^{nd}$ emission layer over the $1\text{-}2^{nd}$ pixel electrode and to generate the light of the wavelength belonging to the first wavelength range; and an opposite electrode over the $1\text{-}1^{st}$ emission layer and the $1\text{-}2^{nd}$ emission layer.

The organic light-emitting display apparatus may further include: a $1\text{-}3^{rd}$ pixel electrode disposed in a $1\text{-}3^{rd}$ pixel disposed over the substrate and to emit light of a wavelength belonging to the first wavelength range; and a $1\text{-}3^{rd}$ emission layer disposed over the $1\text{-}3^{rd}$ pixel electrode to generate the light of the wavelength belonging to the first wavelength range, wherein the opposite electrode may be disposed over the $1\text{-}1^{st}$, $1\text{-}2^{nd}$, and $1\text{-}3^{rd}$ emission layers, and the pixel-defining layer may cover an edge of the $1\text{-}3^{rd}$ pixel electrode so as to define a $1\text{-}3^{rd}$ exposed upper surface including a center of an upper surface of the $1\text{-}3^{rd}$ pixel electrode such that a $1\text{-}3^{rd}$ area of the $1\text{-}3^{rd}$ exposed upper surface may differ in size from the $1\text{-}1^{st}$ area and the $1\text{-}2^{nd}$ area.

The $1\text{-}2^{nd}$ area may be smaller than $1\text{-}1^{st}$ area, and the $1\text{-}3^{rd}$ area may be greater than the $1\text{-}1^{st}$ area.

The organic light-emitting display apparatus may further include: a $2\text{-}1^{st}$ pixel electrode disposed in a $2\text{-}1^{st}$ pixel to emit light of a wavelength belonging to a second wavelength range which is different from the first wavelength range, and a $2\text{-}2^{nd}$ pixel electrode disposed in a $2\text{-}2^{nd}$ pixel to emit light of a wavelength belonging to the second wavelength range, wherein the $2\text{-}1^{st}$ pixel and the $2\text{-}2^{nd}$ pixel may be disposed over the substrate; and a $2\text{-}1^{st}$ emission layer disposed over the $2\text{-}1^{st}$ pixel electrode to generate the light of the wavelength belonging to the second wavelength range and a $2\text{-}2^{nd}$ emission layer disposed over the $2\text{-}2^{nd}$ pixel electrode to generate the light of the wavelength belonging to the second wavelength range, wherein the opposite electrode may be disposed over the $1\text{-}1^{st}$ emission layer, the $1\text{-}2^{nd}$ emission layer, the $2\text{-}1^{st}$ emission layer, and the $2\text{-}2^{nd}$ emission layer, and the pixel-defining layer may cover an edge of the $2\text{-}1^{st}$ pixel electrode and an edge of the $2\text{-}2^{nd}$ pixel electrode so as to define a $2\text{-}1^{st}$ exposed upper surface including a center of an upper surface of the $2\text{-}1^{st}$ pixel electrode and a $2\text{-}2^{nd}$ exposed upper surface including a center of an upper surface of the $2\text{-}2^{nd}$ pixel electrode such that a $2\text{-}2^{nd}$ area of the $2\text{-}2^{nd}$ exposed upper surface may differ in size from a $2\text{-}1^{st}$ area of the $2\text{-}1^{st}$ exposed upper surface.

A ratio of the size of the $1\text{-}2^{nd}$ area to the $1\text{-}1^{st}$ area may be substantially equal to a ratio of the size of the $2\text{-}2^{nd}$ area to the $2\text{-}1^{st}$ area.

The organic light-emitting display apparatus may further include: a $1\text{-}3^{rd}$ pixel electrode disposed in a $1\text{-}3^{rd}$ pixel disposed over the substrate to emit light of a wavelength belonging to the first wavelength range; a $1\text{-}3^{rd}$ emission layer disposed over the $1\text{-}3^{rd}$ pixel electrode to generate the light of the wavelength belonging to the first wavelength range; a $2\text{-}3^{rd}$ pixel electrode disposed in a $2\text{-}3^{rd}$ pixel disposed over the substrate to emit light of a wavelength belonging to the second wavelength range; and a $2\text{-}3^{rd}$ emission layer disposed over the $2\text{-}3^{rd}$ pixel electrode to generate the light of the wavelength belonging to the second wavelength range, wherein the opposite electrode may be disposed over the $1\text{-}1^{st}$, $1\text{-}2^{nd}$, and $1\text{-}3^{rd}$ emission layers and the $2\text{-}1^{st}$, $2\text{-}2^{nd}$, and $2\text{-}3^{rd}$ emission layers, and the pixel-defining layer may cover an edge of the $1\text{-}3^{rd}$ pixel electrode so as to define a $1\text{-}3^{rd}$ exposed upper surface including a center of an upper surface of the $1\text{-}3^{rd}$ pixel electrode and covers an edge of the $2\text{-}3^{rd}$ pixel electrode so as to define a $2\text{-}3^{rd}$ exposed upper surface including a center of an upper surface of the $2\text{-}3^{rd}$ pixel electrode such that a $1\text{-}3^{rd}$ area of the $1\text{-}3^{rd}$ exposed upper surface may differ in size from the $1\text{-}1^{st}$ area and the $1\text{-}2^{nd}$ area and a $2\text{-}3^{rd}$ area of the $2\text{-}3^{rd}$ exposed upper surface may differ in size from the $2\text{-}1^{st}$ area and the $2\text{-}2^{nd}$ area.

The $1\text{-}2^{nd}$ area may be smaller than the $1\text{-}1^{st}$ area, and the $1\text{-}3^{rd}$ area may be greater than the $1\text{-}1^{st}$ area, and the $2\text{-}2^{nd}$ area may be smaller than $2\text{-}1^{st}$ area, and the $2\text{-}3^{rd}$ area may be greater than the $2\text{-}1^{st}$ area.

A ratio of the $1\text{-}2^{nd}$ area to the $1\text{-}1^{st}$ area may be substantially equal to a ratio of the size of the $2\text{-}2^{nd}$ area to the $2\text{-}1^{st}$ area, and a ratio of the $1\text{-}1^{st}$ area to the $1\text{-}3^{rd}$ area may be substantially equal to a ratio of the size of the $2\text{-}1^{st}$ area to the $2\text{-}3^{rd}$ area.

The percentage of increase in the size of the $1\text{-}2^{nd}$ area to the $1\text{-}1^{st}$ area may be substantially equal to the percentage of increase in the size of the $1\text{-}1^{st}$ area to the $1\text{-}3^{rd}$ area.

According to another aspect of the invention, an organic light-emitting display apparatus includes: a substrate; a plurality of first pixel electrodes disposed in a first column over the substrate; a pixel-defining layer covering an edge of each of the plurality of first pixel electrodes to define first exposed upper surfaces including centers of upper surfaces of the plurality of first pixel electrodes; a first emission layer disposed over the plurality of first pixel electrodes and to generate light of a wavelength belonging to a first wavelength range; and an opposite electrode disposed over the first emission layer, wherein one or more of the first exposed upper surfaces have a first area in the first column, and another or others of the first exposed upper surfaces have a second area in the first column, which has a difference in size from the first area.

Locations of the one or more of the first exposed upper surfaces having the first area, and locations of the another or others of the first exposed upper surfaces having the second area, may be randomly distributed.

Another or others of the first exposed upper surfaces may have a third area in the first column, which has a difference in size from the first area and the second area.

Locations of the one or more of the first exposed upper surfaces having the first area, locations of the another or others of the first exposed upper surfaces having the second area, and locations of the yet another or others of the first exposed upper surfaces having the third area, may be randomly distributed.

The organic light-emitting display apparatus may further include: a plurality of second pixel electrodes disposed in a second column over the substrate; and a second emission layer disposed over the plurality of second pixel electrodes and to generate light of a wavelength belonging to a second wavelength range, wherein the pixel-defining layer may cover an edge of each of the plurality of second pixel electrodes to define second exposed upper surfaces including centers of upper surfaces of the plurality of second pixel electrodes, the opposite electrode may be disposed over the second emission layer, and one or more of the second exposed upper surfaces may have a fourth area in the second column and another or others of the second exposed upper surfaces may have a fifth area in the second column, which has a difference in size from the fourth area.

Locations of the one or more of the second exposed upper surfaces having the fourth area in the second column, and locations of the another or others of the second exposed upper surfaces having the fifth area in the second column, may be randomly distributed.

Another or others of the second exposed upper surfaces may have a sixth area in the second column, which has a difference in size from the fourth area and the fifth area.

Locations of the one or more of the second exposed upper surfaces having the fourth area, locations of the another or others of the second exposed upper surfaces having the fifth area, and locations of the yet another or others of the second exposed upper surfaces having the sixth area, may be randomly distributed.

The second area may be smaller than the first area, and the fifth area may be smaller than the fourth area.

A ratio of the size of the second area to the first area may be substantially equal to a ratio of the size of the fifth area to the fourth area.

According to another aspect of the invention, a display apparatus includes: a substrate; a $1\text{-}1^{st}$ pixel and a $1\text{-}2^{nd}$ pixel disposed over the substrate; and a $1\text{-}1^{st}$ color filter layer and a $1\text{-}2^{nd}$ color filter layer, wherein the $1\text{-}1^{st}$ color filter layer is configured to transmit light of a wavelength belonging to a first wavelength range, overlaps the $1\text{-}1^{st}$ pixel, and has an upper surface having a $1\text{-}1^{st}$ area, the upper surface of the $1\text{-}1^{st}$ color filter layer facing away from the substrate, and the $1\text{-}2^{nd}$ color filter layer is configured to transmit light of a wavelength belonging to the first wavelength range, overlaps the $1\text{-}2^{nd}$ pixel, and has an upper surface having a $1\text{-}2^{nd}$ area, which has a difference in size from the $1\text{-}1^{st}$ area, the upper surface of the $1\text{-}2^{nd}$ color filter layer facing away from the substrate.

The display apparatus may further include: a $1\text{-}3^{rd}$ pixel disposed over the substrate; and a $1\text{-}3^{rd}$ color filter layer to transmit light of a wavelength belonging to the first wavelength range, overlapping the $1\text{-}3^{rd}$ pixel, and having an upper surface having a $1\text{-}3^{rd}$ area, which has a difference in size from the $1\text{-}1^{st}$ area and the $1\text{-}2^{nd}$ area, the upper surface of the $1\text{-}3^{rd}$ color filter layer facing away from the substrate.

The $1\text{-}2^{nd}$ area may be smaller than the $1\text{-}1^{st}$ area, and the $1\text{-}3^{rd}$ area may be greater than the $1\text{-}1^{st}$ area.

The display apparatus may further include: a $2\text{-}1^{st}$ pixel and a $2\text{-}2^{nd}$ pixel disposed over the substrate; and a $2\text{-}1^{st}$ color filter layer and a $2\text{-}2^{nd}$ color filter layer, wherein the $2\text{-}1^{st}$ color filter layer may be configured to transmit light of a wavelength belonging to a second wavelength range that is different from the first wavelength range, corresponds to the $2\text{-}1^{st}$ pixel, and may have an upper surface having a $2\text{-}1^{st}$ area, the upper surface of the $2\text{-}1^{st}$ color filter layer facing away from the substrate, and the $2\text{-}2^{nd}$ color filter layer may be configured to transmit light of a wavelength belonging to the second wavelength range, corresponds to the $2\text{-}2^{nd}$ pixel, and may have an upper surface having a $2\text{-}2^{nd}$ area, which has a difference in size from the $2\text{-}1^{st}$ area, the upper surface of the $2\text{-}2^{nd}$ color filter layer facing away from the substrate.

A ratio in size of the $1\text{-}2^{nd}$ area to the $1\text{-}1^{st}$ area may be substantially equal to a ratio of the difference in size of the $2\text{-}2^{nd}$ area to the $2\text{-}1^{st}$ area.

The display apparatus may further include: a $1\text{-}3^{rd}$ pixel and a $2\text{-}3^{rd}$ pixel disposed over the substrate; a $1\text{-}3^{rd}$ color filter layer to transmit light of a wavelength belonging to the first wavelength range, overlapping the $1\text{-}3^{rd}$ pixel, and having an upper surface having a $1\text{-}3^{rd}$ area which has a difference in size from the $1\text{-}1^{st}$ area and the $1\text{-}2^{nd}$ area, the upper surface of the $1\text{-}3^{rd}$ color filter layer facing away from the substrate; and a $2\text{-}3^{rd}$ color filter layer to transmit light of a wavelength belonging to the second wavelength range, overlapping the $2\text{-}3^{rd}$ pixel, and having an upper surface having a $2\text{-}3^{rd}$ area which has a difference in size from the 2-1$^{st}$ area and the 2-2$^{nd}$ area, the upper surface of the 2-3$^{rd}$ color filter layer facing away from the substrate.

The 1-2$^{nd}$ area may be smaller than the 1-1$^{st}$ area, and the 1-3$^{rd}$ area may be greater than the 1-1$^{st}$ area, and the 2-2$^{nd}$ area may be smaller than the 2-1$^{st}$ area, and the 2-3$^{rd}$ area may be greater than the 2-1$^{st}$ area.

A ratio of the size of the 1-2$^{nd}$ area to the 1-1$^{st}$ area may be substantially equal to a ratio of the size of the 2-2$^{nd}$ area to the 2-1$^{st}$ area, and a ratio of the size of the 1-1$^{st}$ area to the 1-3$^{rd}$ area may be substantially equal to a ratio of the size of the 2-1$^{st}$ area to the 2-3$^{rd}$ area.

The percentage of increase in the size of the 1-2$^{nd}$ area to the 1-1$^{st}$ area may be substantially equal to the percentage of increase in the size of the 1-1$^{st}$ area to the 1-3$^{rd}$ area.

According to another aspect of the invention, a display apparatus includes: a substrate; a plurality of first pixels disposed in a first column over the substrate; and first color filter layers to transmit light of wavelength belonging to a first wavelength range and overlapping the first pixels, wherein one or more of first upper surfaces of the first color filter layers have a first area in the first column, and another or others of the first upper surfaces of the first color filter layers have a second area in the first column, which has a difference in size from the first area, the first upper surfaces facing away from the substrate.

Locations of the one or more of the first upper surfaces having the first area, and locations of the another or others of the first upper surfaces having the second area, may be randomly distributed.

Another or others of the first upper surfaces may have a third area in the first column, which has a difference in size from the first area and the second area.

Locations of the one or more of the first upper surfaces having the first area, locations of the another or others of the first upper surfaces having the second area, and locations of the yet another or others of the first upper surfaces having the third area, may be randomly distributed.

The display apparatus may further include: a plurality of second pixels disposed in a second column over the substrate; and second color filter layers to transmit light of a wavelength belonging to a second wavelength range, which is different from the first wavelength range, and overlapping the second pixels, wherein one or more of second upper surfaces of the second color filter layers facing away from the substrate may have a fourth area in the second column, and another or others of the second upper surfaces of the second color filter layers may have a fifth area in the second column, which has a difference in size from the fourth area.

Locations of the one or more of the second upper surfaces having the fourth area, and locations of the another or others of the second upper surfaces having the fifth area, may be randomly distributed.

Another or others of the second upper surfaces may have a sixth area in the second column, which has a difference in size from the fourth area and the fifth area.

Locations of the one or more of the second upper surfaces having the fourth area, locations of the another or others of the second upper surfaces having the fifth area, and locations of the yet another or others of the second upper surfaces having the sixth area, may be randomly distributed.

The second area may be smaller than the first area, and the fifth area may be smaller than the fourth area.

A ratio of the size of the second area to the first area may be substantially equal to a ratio of the size of the fifth area to the fourth area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 2 is a schematic plan view of a portion of the organic light-emitting display apparatus of FIGS. 1A and 1B.

FIGS. 7A and 7B are schematic cross-sectional views of portions of another exemplary embodiment of an organic light-emitting display apparatus constructed according to the principles of the invention.

DETAILED DESCRIPTION

Figure 1A:
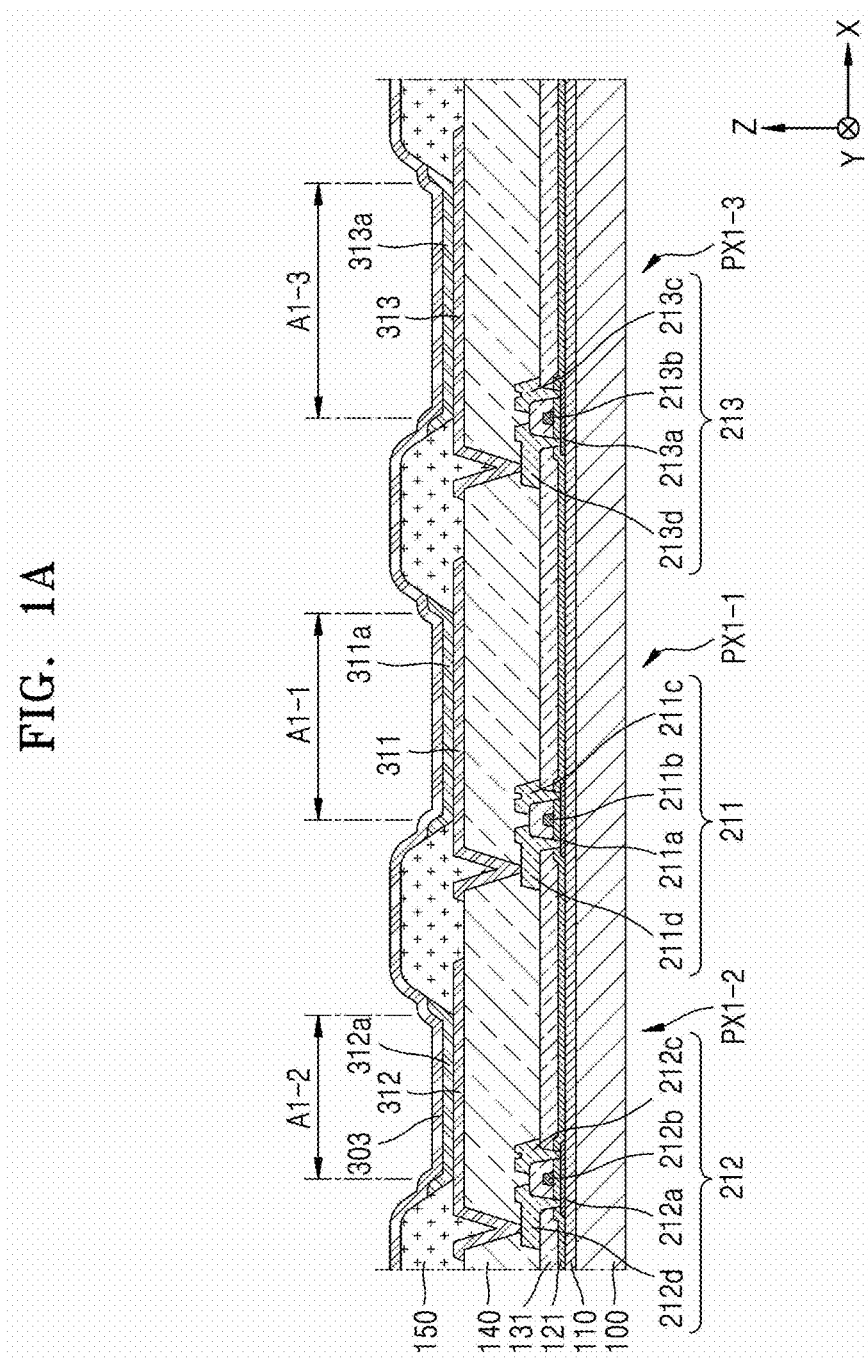
FIGS. 1A and 1B are schematic cross-sectional views of portions of an exemplary embodiment of an organic light-emitting display apparatus constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
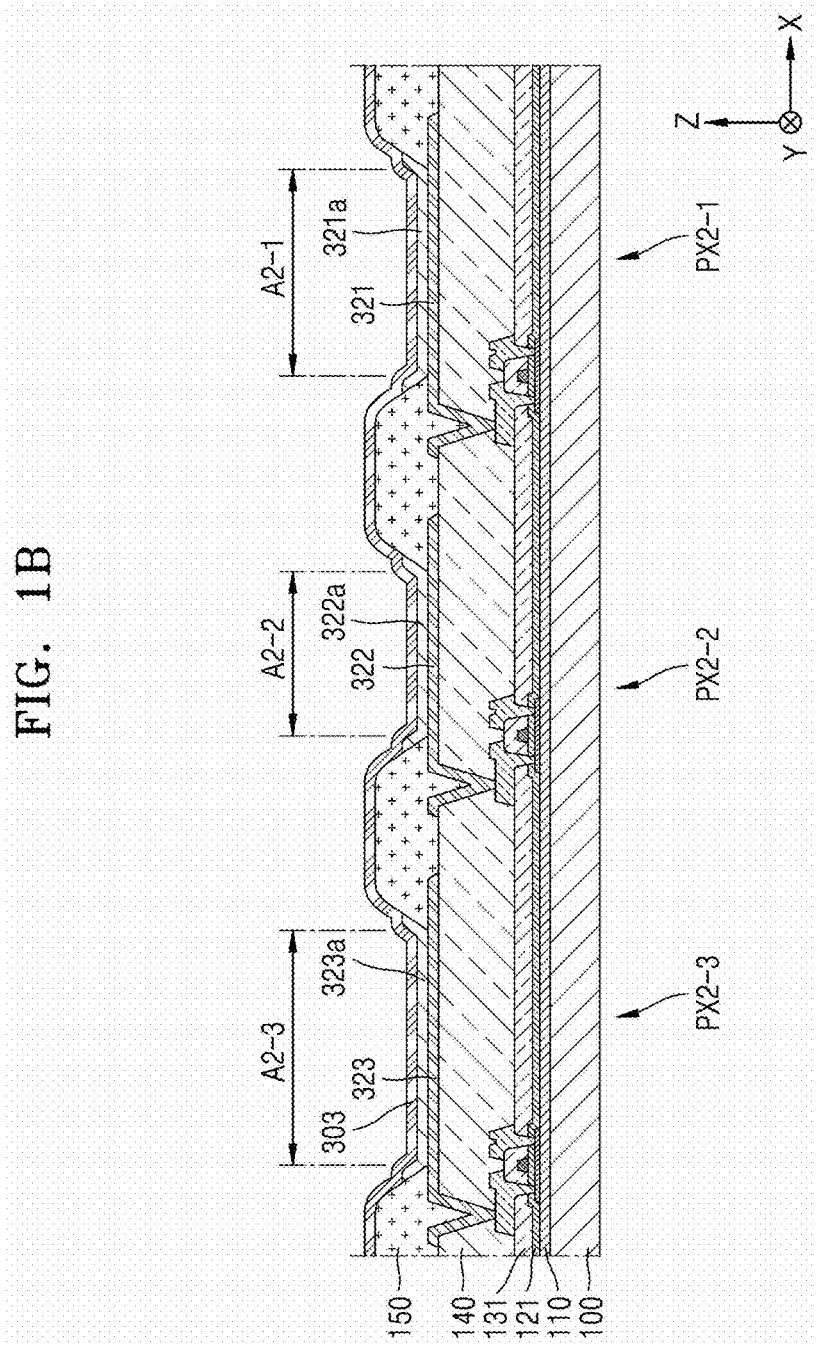

FIGS. 1A and 1B are schematic cross-sectional views of portions of an exemplary embodiment of an organic light-emitting display apparatus constructed according to the principles of the invention, and FIG. 2 is a schematic plan view of a portion of the organic light-emitting display apparatus of FIGS. 1A and 1B. FIG. 1A may be understood as the cross-sectional view of the organic light-emitting display apparatus, which is taken along a line I-I of FIG. 2.

FIG. 1A, for convenience of description, schematically illustrates a portion of each of three pixels of the organic light-emitting display apparatus. Unlike the illustration in FIG. 1A, components of thin-film transistors may not be located in the cross-sectional plane (e.g., the same z-x plane). For example, at least one of a 1-$2^{nd}$ gate electrode 212b, a 1-$2^{nd}$ source electrode 212c, and a 1-$2^{nd}$ drain electrode 212d of a 1-$2^{nd}$ thin-film transistor 212 may not be located in the same z-x plane. Various modifications are possible. For example, only the 1-$2^{nd}$ gate electrode 212b and the 1-$2^{nd}$ source electrode 212c may be located in the same z-x plane, and the 1-$2^{nd}$ drain electrode 212d may not be located in the same z-x plane.

In the organic light-emitting display apparatus according to the illustrated exemplary embodiment, a plurality of pixels may be located in a display area, as illustrated in FIG. 1A. A peripheral area located outside the display area may include a pad area, which is an area in which various electronic devices, printed circuit boards, and the like are electrically coupled. This may also denote that a substrate 100 may have the display area and the peripheral area.

The substrate 100 may include glass, metal, or polymer resins. In the case where the substrate 100 is flexible or bendable, the substrate 100 may include polymer resins, such as polyethersulphone, polyacrylate, polyetherimide, polyethylene naphthalate, polyethylene terephthalate, polyphenylene sulfide, polyarylate, polyimide, polycarbonate, or cellulose acetate propionate. However, various modifications may be possible. For example, the substrate 100 may have a multi-layered structure of two layers each including the polymer resins described above and a barrier layer between the two layers, the barrier layer including an inorganic material such as silicon oxide, silicon nitride, silicon oxynitride, or the like.

As used herein, the term "1-1$^{st}$" means a position in a matrix by defined by a first column and a second row, the term "1-2$^{nd}$" means a position defined by the first column and a first row, and the term "1-3$^{rd}$" mean a position by defined by the first column and a third row. Further, the term "2-1$^{st}$" means a position by defined by a second column and the third row, the term "2-2$^{nd}$" may mean a position defined by the second column and the second row, and the term "2-3$^{rd}$" mean a position by defined by the second column and the first row. For example, the first, second, and third columns may be repeated in a direction of the Y axis, and the first, second, and third rows may be repeated in a direction of the X axis.

Organic light-emitting devices may be arranged on the substrate 100. However, in addition to the organic light-emitting devices, 1-1$^{st}$, 1-2$^{nd}$, and 1-3$^{rd}$ thin-film transistors 211, 212, and 213 to which the organic light-emitting devices are electrically connected may also be located on the substrate 100. That the organic light-emitting devices are electrically connected to the 1-1$^{st}$, 1-2$^{nd}$, and 1-3$^{rd}$ thin-film transistors 211, 212, and 213 may denote that 1-1$^{st}$, 1-2$^{nd}$, and 1-3$^{rd}$ pixel electrodes 311, 312, and 313 of the organic light-emitting devices are electrically connected to the 1-1$^{st}$, 1-2$^{nd}$, and 1-3$^{rd}$ thin-film transistors 211, 212, and 213.

For reference, it is illustrated in FIG. 1A that the 1-1$^{st}$ thin-film transistor 211 is located in a 1-1$^{st}$ pixel PX1-1, the 1-2$^{nd}$ thin-film transistor 212 is located in a 1-2$^{nd}$ pixel PX1-2, and a 1-3$^{rd}$ thin-film transistor 213 is located in a 1-3$^{rd}$ pixel PX1-3. Accordingly, it is illustrated that the 1-1$^{st}$ pixel electrode 311 located in the 1-1$^{st}$ pixel PX1-1 is electrically connected to the 1-1$^{st}$ thin-film transistor 211, the 1-2$^{nd}$ pixel electrode 312 located in the 1-2$^{nd}$ pixel PX1-2 is electrically connected to the 1-2$^{nd}$ thin-film transistor 212, and the 1-3$^{rd}$ pixel electrode 313 located in the 1-3$^{rd}$ pixel PX1-3 is electrically connected to the 1-3$^{rd}$ thin-film transistor 213.

The 1-1$^{st}$ pixel PX1-1, the 1-2$^{nd}$ pixel PX1-2, and the 1-3$^{rd}$ pixel PX1-3 may emit light of wavelengths belonging to a substantially same wavelength range. For example, the 1-1$^{st}$ pixel PX1-1, the 1-2$^{nd}$ pixel PX1-2, and the 1-3$^{rd}$ pixel PX1-3 may emit light of wavelengths belonging to a first wavelength range. However, other pixels than the pixels described above may emit light of wavelengths belonging to a second wavelength range and yet other pixels may emit light of wavelengths belonging to a third wavelength range. Here, the first wavelength range may be a wavelength range including, for example, a red light, the second wavelength range may be a wavelength range including, for example, a green light, and the third wavelength range may be a wavelength range including, for example, a blue light. In this case, the first wavelength range may be between about 630 nm and about 780 nm, the second wavelength range may be between about 495 nm and about 570 nm, and the third wavelength range may be between about 450 nm and about 495 nm. However, exemplary embodiments are not limited thereto. The first, second, and third wavelength ranges may be different from the wavelength ranges described above.

Hereinafter, for descriptive convenience, descriptions will be given with respect to the 1-1$^{st}$ thin-film transistor 211. The descriptions may be applied to the 1-2$^{nd}$ thin-film transistor 212 and the 1-3$^{rd}$ thin-film transistor 213. In other words, descriptions of components of the 1-2$^{nd}$ thin-film transistor 212 and the 1-3$^{rd}$ thin-film transistor 213 will be omitted.

The 1-1$^{st}$ thin-film transistor 211 may include a 1-1$^{st}$ semiconductor layer 211a, a 1-1$^{st}$ gate electrode 211b, a 1-1$^{st}$ source electrode 211c, and a 1-1$^{st}$ drain electrode 211d, which may include amorphous silicon, polycrystalline silicon, or an organic semiconductor material. The 1-1$^{st}$ gate electrode 211b may include various conductive materials and have various layered structures. For example, the 1-1$^{st}$ gate electrode 211b may include a molybdenum (Mo) layer and an aluminum (Al) layer. The 1-1$^{st}$ source electrode 211c and the 1-1$^{st}$ drain electrode 211d may also include various conductive materials and have various layered structures. For example, the 1-1$^{st}$ source electrode 211c and the 1-1$^{st}$ drain electrode 211d may include a titanium (Ti) layer and an Al layer.

To obtain insulating properties between the 1-1$^{st}$ semiconductor layer 211a and the 1-1$^{st}$ gate electrode 211b, a gate insulating layer 121 including an inorganic material, such as silicon oxide, silicon nitride, and/or silicon oxynitride, may be included between the 1-1$^{st}$ semiconductor layer 211a and the 1-1$^{st}$ gate electrode 211b. Also, an interlayer insulating layer 131 including an inorganic material, such as silicon nitride, silicon oxynitride, silicon oxide, titanium oxide, or aluminum oxide may be arranged above the 1-1$^{st}$ gate electrode 211b, and the 1-1$^{st}$ source electrode 211c and the 1-1$^{st}$ drain electrode 211d may be arranged on the interlayer insulating layer 131. The insulating layers including the inorganic material may be formed by chemical vapor deposition (CVD) or atomic layer deposition (ALD). This aspect is likewise applied to the exemplary embodiments described below.

A buffer layer 110 may be arranged between the 1-1$^{st}$ thin-film transistor 211 having the structure described above and the substrate 100. For example, the buffer layer 110 includes at least one of a silicon nitride layer, a silicon oxynitride layer, a silicon oxide layer, a titanium oxide layer, and an aluminum oxide layer. The buffer layer 110 may increase planarization of an upper surface of the substrate 100 or may prevent or minimize penetration of impurities from the substrate 100 or the like into the 1-1$^{st}$ semiconductor layer 211a of the 1-1$^{st}$ thin-film transistor 211.

Also, a planarization layer 140 may be arranged on the 1-1$^{st}$ thin-film transistor 211. For example, when, as illustrated in FIG. 1A, the organic light-emitting device is arranged above the 1-1$^{st}$ thin-film transistor 211, the planarization layer 140 may approximately planarize an upper portion of a protection layer covering the 1-1$^{st}$ thin-film transistor 211. The planarization layer 140 may include an organic material, such as acryl resins, epoxy resins, phenolic resins, polyamide resins, polyimide resins, benzocyclobutene (BCB), hexamethyldisiloxane (HMDSO), or the like. Although FIG. 1A illustrates that the planarization layer 140 includes a single layer, the planarization layer 140 may include multiple layers. For example, the planarization layer 140 may be modified in various ways.

In the display area of the substrate 100, the 1-1$^{st}$ pixel electrode 311 and the 1-2$^{nd}$ pixel electrode 312 may be located on the planarization layer 140. The 1-1$^{st}$ pixel electrode 311 on the planarization layer 140 may contact any one of the 1-1$^{st}$ source electrode 211c and the 1-1$^{st}$ drain electrode 211d through an opening in the planarization layer 140 or the like as illustrated in FIG. 1A and may be electrically connected to the 1-1$^{st}$ thin-film transistor 211. Likewise, the 1-2$^{nd}$ pixel electrode 312 on the planarization layer 140 may contact any one of the 1-2$^{nd}$ source electrode 212c and the 1-2$^{nd}$ drain electrode 212d through an opening in the planarization layer 140 or the like and may be electrically connected to the 1-2$^{nd}$ thin-film transistor 212.

In the case of a top-emission-type display apparatus, which emits light to the outside through an opposite electrode 303, the 1-1$^{st}$, 1-2$^{nd}$, and 1-3$^{rd}$ pixel electrodes 311, 312, and 313 may be formed by including a metal material, which has a high reflectivity, such as a stack of Al and Ti (e.g., Ti/Al/Ti), a stack of Al and ITO (e.g., ITO/Al/ITO), a stack of silver (Ag) and ITO (e.g., ITO/Ag/ITO), an Ag, palladium (Pd), and copper (Cu) (e.g., APC) alloy, a stack of an APC alloy and ITO (e.g., ITO/APC/ITO), or the like. The APC alloy may be an alloy of Ag, Pd, and/or Cu.

In the case of a bottom-emission-type display apparatus, which emits light to the outside through the 1-1$^{st}$, 1-2$^{nd}$, and 1-3$^{rd}$ pixel electrodes 311, 312, and 313, the 1-1$^{st}$, 1-2$^{nd}$, and 1-3$^{rd}$ pixel electrodes 311, 312, and 313 may include a transparent conductive material (TCO), such as ITO and IZO, which permits light transmission, or a semi-transmissive conductive material, such as magnesium (Mg), Ag, or an alloy of Mg and Ag.

A pixel-defining layer 150 may be arranged on the planarization layer 140. The pixel-defining layer 150 may have openings overlapping sub-pixels, respectively, thereby defining a pixel. For example, the pixel-defining layer 150 may cover edges of the 1-1$^{st}$ pixel electrode 311, the 1-2$^{nd}$ pixel electrode 312, and the 1-3$^{rd}$ pixel electrode 313, thereby defining a 1-1$^{st}$ exposed upper surface ETS1-1 (e.g., see FIG. 2) including the center of an upper surface of the 1-1$^{st}$ pixel electrode 311, a 1-2$^{nd}$ exposed upper surface ETS1-2 (e.g., see FIG. 2) including the center of an upper surface of the 1-2$^{nd}$ pixel electrode 312, and a 1-3$^{rd}$ exposed upper surface ETS1-3 (e.g., see FIG. 2) including the center of an upper surface of the 1-3$^{rd}$ pixel electrode 313. Here, the pixel-defining layer 150 may define the 1-2$^{nd}$ exposed upper surface ETS1-2 and the 1-1$^{st}$ exposed upper surface ETS1-1 such that a 1-2$^{nd}$ area (or size) A1-2 of the 1-2$^{nd}$ exposed upper surface ETS1-2 is different from a 1-1$^{st}$ area (or size) A1-1 of the 1-1$^{st}$ exposed upper surface ETS1-1.

The pixel-defining layer 150 may prevent an arc, etc. from occurring, for example, at the edge of the 1-1$^{st}$ pixel electrode 311, by increasing a distance between the edge of the 1-1$^{st}$ pixel electrode 311 and the opposite electrode 303 above the 1-1$^{st}$ pixel electrode 311 or the like. The pixel-defining layer 150 may include an organic material, such as acryl resins, epoxy resins, phenolic resins, polyamide resins, polyimide resins, HMDSO, or the like.

A 1-1$^{st}$ emission layer 311a may be located on the 1-1$^{st}$ pixel electrode 311, a 1-2$^{nd}$ emission layer 312a may be located on the 1-2$^{nd}$ pixel electrode 312, and a 1-3$^{rd}$ emission layer 313a may be located on the 1-3$^{rd}$ pixel electrode 313. The 1-1$^{st}$ emission layer 311a, the 1-2$^{nd}$ emission layer 312a, and the 1-3$^{rd}$ emission layer 313a may generate light of wavelengths in the first wavelength range. The 1-1$^{st}$, 1-2$^{nd}$, and 1-3$^{rd}$ emission layers 311a, 312a, and 313a may be formed by an inkjet printing method.

However, not only the 1-1$^{st}$, 1-2$^{nd}$, and 1-3$^{rd}$ emission layers 311a, 312a, and 313a may be located on the 1-1$^{st}$, 1-2$^{nd}$, and 1-3$^{rd}$ pixel electrodes 311, 312, and 313. For example, a hole injection layer (HIL) or a hole transport layer (HTL) may be arranged between the 1-1$^{st}$, 1-2$^{nd}$, and 1-3$^{rd}$ pixel electrodes 311, 312, and 313 and the 1-1$^{st}$, 1-2$^{nd}$, and 1-3$^{rd}$ emission layers 311a, 312a, and 313a, and an electron transport layer (ETL), an electron injection layer (EIL), or the like may be located on the 1-1$^{st}$, 1-2$^{nd}$, and 1-3$^{rd}$ emission layers 311a, 312a, and 313a. The HIL, the HTL, the ETL, and/or the EIL may be integrally formed as a single unitary member throughout the plurality of pixel electrodes 311, 312, and 313, or according to necessity, may be patterned to respectively correspond to the 1-1$^{st}$, 1-2$^{nd}$, and 1-3$^{rd}$ pixel electrodes 311, 312, and 313. The HIL, the HTL, the ETL, and/or the EIL may be formed by a deposition method, a screen printing method, a laser heat transfer method, an inkjet printing method, or the like.

The opposite electrode 303 may be located on the 1-1$^{st}$, 1-2$^{nd}$, and 1-3$^{rd}$ emission layers 311a, 312a, and 313a. The opposite electrode 303 may be arranged to cover the display area. For example, the opposite electrode 303 may be integrally formed as a single unitary member throughout the plurality of organic light-emitting devices and may correspond to the plurality of pixel electrodes 311, 312, and 313.

The opposite electrode 303 may cover the display area, while extending to a peripheral area outside the display area. Accordingly, the opposite electrode 303 may be electrically connected to an electrode power supply line located in the peripheral area. In the case of a top-emission-type display apparatus, the opposite electrode 303 may include a TCO, such as ITO or IZO, which permits light transmission, or a semi-transmissive conductive material, such as Mg, Ag, or an alloy of Mg and Ag. In the case of a bottom-emission-type display apparatus, the opposite electrode 303 may include a metal material having a high reflectivity, such as a stack of Al and Ti (e.g., Ti/Al/Ti), a stack of Al and ITO (e.g., ITO/Al/ITO), an APC alloy, and a stack of an APC alloy and ITO (e.g., ITO/APC/ITO). The APC alloy may be an alloy of Ag, Pd, and/or Cu.

The organic light-emitting device may be vulnerable to external moisture or oxygen, and thus, may be protected by being covered by an encapsulation layer. The encapsulation layer may cover the display area and extend to at least a portion of the peripheral area. The encapsulation layer may include a first inorganic encapsulation layer, an organic encapsulation layer, and a second inorganic encapsulation layer.

The first inorganic encapsulation layer and the second inorganic encapsulation layer may include silicon nitride, silicon oxynitride, silicon oxide, titanium oxide, or aluminum oxide. The organic encapsulation layer may include acryl resins, epoxy resins, phenolic resins, polyamide resins, or polyimide resins.

As described above, the 1-1$^{st}$ emission layer 311a, the 1-2$^{nd}$ emission layer 312a, and the like may be formed by an inkjet printing method. For example, the 1-1$^{st}$ emission layer 311a and the 1-2$^{nd}$ emission layer 312a may be formed by depositing, by inkjet printing, a material for forming an emission layer on the 1-1$^{st}$ exposed upper surface ETS1-1 of the 1-1$^{st}$ pixel electrode 311 and the 1-2$^{nd}$ exposed upper surface ETS1-2 of the 1-2$^{nd}$ pixel electrode 312, which are exposed by the pixel-defining layer 150. Here, the 1-1$^{st}$ emission layer 311a and the 1-2$^{nd}$ emission layer 312a may be simultaneously formed by using an inkjet printing device having a plurality of nozzles. In this process, because one nozzle may be located in one pixel to form the emission layer, a nozzle for injecting a material for forming the 1-1$^{st}$ emission layer 311a and a nozzle for injecting a material for forming the 1-2$^{nd}$ emission layer 312a may be different from each other. In other words, the 1-1$^{st}$ emission layer 311a and the 1-2$^{nd}$ emission layer 312a may be formed by the different nozzles because it may be impossible to locate a plurality of nozzles in each of the pixels due to the small size of each pixel in a high-resolution display apparatus. Thus, when forming the 1-1$^{st}$ emission layer 311a and the 1-2$^{nd}$ emission layer 312a, the nozzle for injecting the material for forming the 1-1$^{st}$ emission layer 311a and the nozzle for injecting the material for forming the 1-2$^{nd}$ emission layer 312a may be different from each other. The amount of injection of the nozzle for injecting the material for forming the 1-1$^{st}$ emission layer 311a and the amount of injection of the nozzle for injecting the material for forming the 1-2$^{nd}$ emission layer 312a may not be the same as each other. Ideally, nozzles may be able to inject substantially the same pre-defined quantities of materials. However, in the practical account, there may be errors in the amount of injection. Thus, the quantity of the material injected for forming the 1-1$^{st}$ emission layer 311a and the quantity of the material injected for forming the 1-2$^{nd}$ emission layer 312a may become different from each other. This may result in the thickness of the 1-1$^{st}$ emission layer 311a and the thickness of the 1-2$^{nd}$ emission layer 312a being different from each other. In this case, after the organic light-emitting display apparatus is manufactured, even when the same electrical signals are applied to the 1-1$^{st}$ pixel PX1-1 and the 1-2$^{nd}$ pixel PX1-2, a brightness of the 1-1$^{st}$ pixel PX1-1 and a brightness of the 1-2$^{nd}$ pixel PX1-2 may become different from each other.

Figure 3:
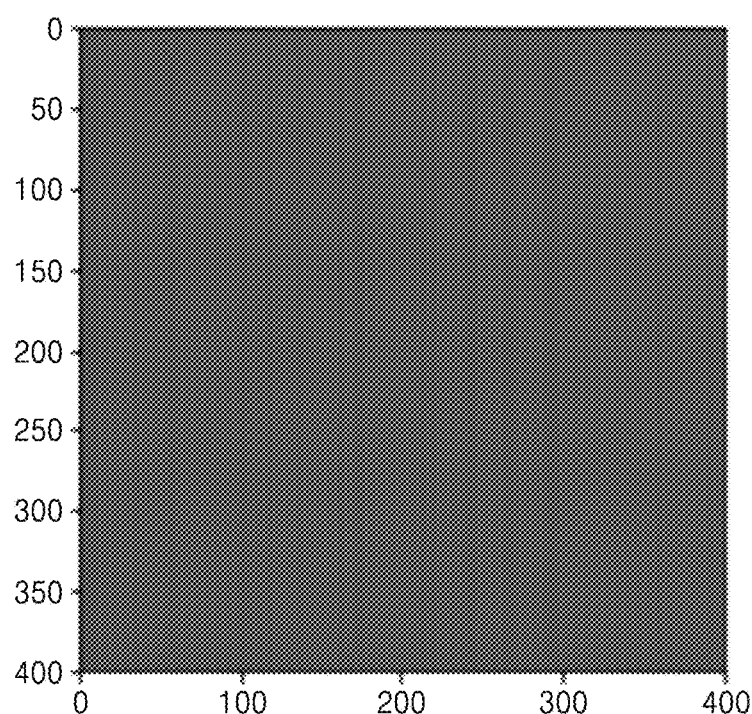
FIG. 3 is a photograph showing a case in which an organic light-emitting display apparatus according to the conventional art emits only in red pixels.

FIG. 3 is a photograph showing a case in which only red pixels emit light in an organic light-emitting display apparatus according to the conventional art. Numbers of the horizontal axis and the vertical axis in FIG. 3 specify a location of a pixel in a display area. FIG. 3 illustrates the case in which the same electrical signals are applied to the red pixels such that the red pixels emit light of the same brightness. However, as shown in FIG. 3, vertical stripes are shown in a red image displayed by the organic light-emitting display apparatus.

The vertical stripes are a phenomenon caused by the difference between the thickness of emission layers in one column and the thickness of emission layers in a column adjacent to the one column. When a red emission layer is formed by an inkjet printing method in a process of manufacturing an organic light-emitting display apparatus, nozzles may be moved toward a substrate or the substrate may be moved toward the nozzles, in a direction of the vertical axis (e.g., the column direction) in FIG. 3. Thus, emission layers of the red pixels located in one column, the emission layers being formed by the same nozzle, may have substantially the same thicknesses. However, because errors in the amount of deposition may occur, the thicknesses of the emission layers of the red pixels in the one column may become different from thicknesses of emission layers of the red pixels in the other columns. This is because although the emission layers of the red pixels in each column are formed by using materials injected by the same nozzle, the nozzles for forming the emission layers of the red pixels may be different in the different columns.

Figure 4:
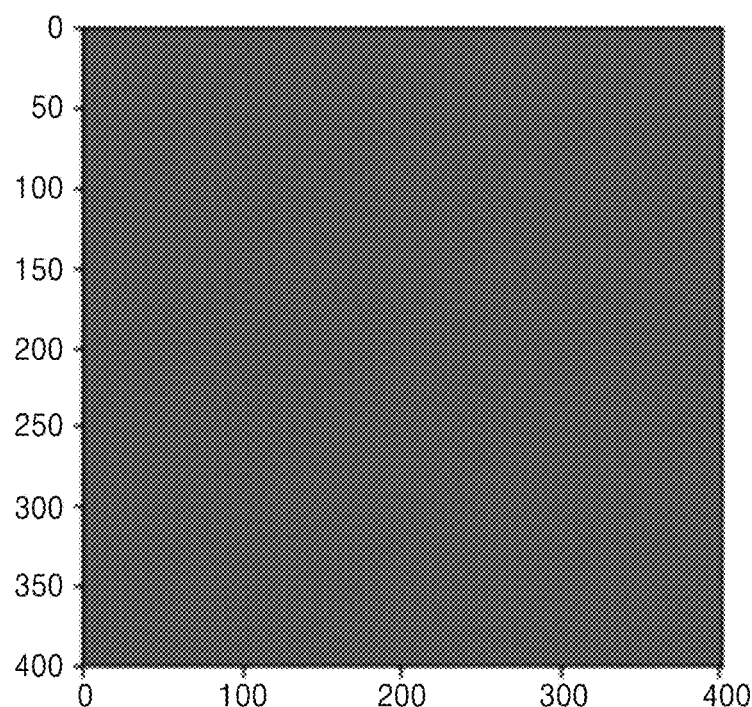
FIG. 4 is a photograph showing a case in which the organic light-emitting display apparatus of FIG. 1 emits only in red pixels.

However, in the case of the organic light-emitting display apparatus according to the illustrated exemplary embodiment, stripes as shown in FIG. 3 are not generated in a photograph of FIG. 4, which indicates a case in which only red pixels emit light. Accordingly, unlike the organic light-emitting display apparatus according to the conventional art, high-quality images may be displayed.

As described above, in the organic light-emitting display apparatus according to the illustrated exemplary embodiment, the pixel-defining layer 150 may cover the edge of the 1-1$^{st}$ pixel electrode 311 and the edge of the 1-2$^{nd}$ pixel electrode 312 so as to define the 1-1$^{st}$ exposed upper surface ETS1-1 including the center of the upper surface of the 1-1$^{st}$ pixel electrode 311 and the 1-2$^{nd}$ exposed upper surface ETS1-2 including the center of the upper surface of the 1-2$^{nd}$ pixel electrode 312. Here, the pixel-defining layer 150 may define the 1-2$^{nd}$ exposed upper surface ETS1-2 and the 1-1$^{st}$ exposed upper surface ETS1-1 such that the 1-2$^{nd}$ area (or size) A1-2 of the 1-2$^{nd}$ exposed upper surface ETS1-2 is different from the 1-1$^{st}$ area (or size) A1-1 of the 1-1$^{st}$ exposed upper surface ETS1-1.

When the 1-2$^{nd}$ area (or size) A1-2 of the 1-2$^{nd}$ exposed upper surface ETS1-2 is different from the 1-1$^{st}$ area (or size) A1-1 of the 1-1$^{st}$ exposed upper surface ETS1-1, even when substantially the same quantities of materials for forming the emission layers are supplied to the 1-1$^{st}$ exposed upper surface ETS1-1 and the 1-2$^{nd}$ exposed upper surface ETS1-2, the 1-1$^{st}$ emission layer 311a and the 1-2$^{nd}$ emission layer 312a that are formed may have different thicknesses. Consequently, even when the same electrical signals are applied to the 1-1$^{st}$ pixel PX1-1 and the 1-2$^{nd}$ pixel PX1-2, the 1-1$^{st}$ pixel PX1-1 and the 1-2$^{nd}$ pixel PX1-2 may have different brightnesses. Thus, even when the same nozzle is used to form the 1-1$^{st}$ emission layer 311a of the 1-1$^{st}$ pixel PX1-1 and the 1-2$^{nd}$ emission layer 312a of the 1-2$^{nd}$ pixel PX1-2, the 1-1$^{st}$ pixel PX1-1 and the 1-2$^{nd}$ pixel PX1-2 being in the same column, each of the pixels in the corresponding column may emit light of a slightly different brightness when the same electrical signals are applied to the pixels. As a result, it is possible to minimize or effectively prevent a phenomenon in which stripes are generated in the columns.

As described above, the pixel-defining layer 150 may define the 1-2$^{nd}$ exposed upper surface ETS1-2 and the 1-1$^{st}$ exposed upper surface ETS1-1 such that the 1-2$^{nd}$ area (or size) A1-2 of the 1-2$^{nd}$ exposed upper surface ETS1-2 is different from the 1-1$^{st}$ area (or size) A1-1 of the 1-1$^{st}$ exposed upper surface ETS1-1. Furthermore, the pixel-defining layer 150 may define the 1-3$^{rd}$ exposed upper surface ETS1-3 such that a 1-3$^{rd}$ area (or size) A1-3 of the 1-3$^{rd}$ exposed upper surface ETS1-3 is different from the 1-1$^{st}$ area (or size) A1-1 of the 1-1$^{st}$ exposed upper surface ETS1-1 and the 1-2$^{nd}$ area (or size) A1-2 of the 1-2$^{nd}$ exposed upper surface ETS1-2. For example, the 1-2$^{nd}$ area (or size) A1-2 may be less than the 1-1$^{st}$ area (or size) A1-1, and the 1-3$^{rd}$ area (or size) A1-3 may be greater than the 1-1$^{st}$ area (or size) A1-1. When the areas (or sizes) of the exposed upper surfaces of the three pixels PX1-1, PX1-2, and PX1-3, which emit light of the first wavelength range, are different from each other as described above, pixels including the three pixels PX1-1, PX1-2, and PX1-3, located in one column, may emit light of slightly different brightnesses when the same electrical signals are applied to the pixels. Thus, it is possible to minimize or effectively prevent the phenomenon in which stripes are generated in the columns.

For reference, the 1-2$^{nd}$ area (or size) A1-2 may be about 97% of the 1-1$^{st}$ area (or size) A1-1, and the 1-3$^{rd}$ area (or size) A1-3 may be about 103% of the 1-1$^{st}$ area (or size) A1-1. In this case, the thickness of the 1-2$^{nd}$ emission layer 312a may be about 95% of the thickness of the 1-1$^{st}$ emission layer 311a, and the thickness of the 1-3$^{rd}$ emission layer 313a may be about 105% of the thickness of the 1-1$^{st}$ emission layer 311a.

It is possible to reduce the probability of the generation of stripes caused by the difference in the quantity of injection between nozzles, by depositing the material for forming an emission layer several times by using different nozzles when forming emission layers corresponding to one pixel. For example, in a first deposition of the material, one nozzle may be used to form emission layers, and in a second deposition of the material, another nozzle may be used to form the emission layers. However, in this case, manufacturing time for forming the emission layer is drastically increased, because inkjet printing for forming the emission layer of one pixel is performed several times. In the case of the organic light-emitting display apparatus according to the illustrated exemplary embodiment, the emission layers of one pixel may be simultaneously formed by using one nozzle, and thus, the organic light-emitting display apparatus may be rapidly manufactured, and the manufacturing time for forming the emission layer may be reduced. In addition, as described above, the exposed upper surfaces having different areas (or sizes) may be randomly located, and thus, the organic light-emitting display apparatus capable of displaying a high-quality image may be realized by minimizing or preventing the stripes in the columns.

As illustrated in FIGS. 1B and 2, the organic light-emitting display apparatus according to the illustrated exemplary embodiment may further include a 2-$1^{st}$ pixel, a 2-$2^{nd}$ pixel and a 2-$3^{rd}$ pixel. The 2-$1^{st}$ pixel, the 2-$2^{nd}$ pixel, and the 2-$3^{rd}$ pixel may be pixels to emit light of wavelengths in the second wavelength range. The first wavelength range may be a wavelength range including, for example, a red light, and the second wavelength range may be a wavelength range including, for example, a green light. A 2-$1^{st}$ pixel electrode 321 may be located in the 2-$1^{st}$ pixel, a 2-$2^{nd}$ pixel electrode 322 may be located in the 2-$2^{nd}$ pixel, and a 2-$3^{rd}$ pixel electrode 323 may be located in the 2-$3^{rd}$ pixel. A 2-$1^{st}$ emission layer 321a may be located on the 2-$1^{st}$ pixel electrode 321, a 2-$2^{nd}$ emission layer 322a may be located on the 2-$2^{nd}$ pixel electrode 322, and a 2-$3^{rd}$ emission layer 323a may be located on the 2-$3^{rd}$ pixel electrode 323. All of the 2-$1^{st}$ emission layer, the 2-$2^{nd}$ emission layer, and the 2-$3^{rd}$ emission layer may generate light of wavelengths in the second wavelength range. The opposite electrode 303 may be located on the 2-$1^{st}$, 2-$2^{nd}$, and 2-$3^{rd}$ emission layers.

The pixel-defining layer 150 may cover edges of the 2-$1^{st}$ pixel electrode 321, the 2-$2^{nd}$ pixel electrode 322, and the 2-$3^{rd}$ pixel electrode 323, thereby defining a 2-$1^{st}$ exposed upper surface ETS2-1 including the center of an upper surface of the 2-$1^{st}$ pixel electrode 321, a 2-$2^{nd}$ exposed upper surface ETS2-2 including the center of an upper surface of the 2-$2^{nd}$ pixel electrode 322, and a 2-$3^{rd}$ exposed upper surface ETS2-3 including the center of an upper surface of the 2-$3^{rd}$ pixel electrode 323. Here, the pixel-defining layer 150 may define the 2-$2^{nd}$ exposed upper surface ETS2-2 and the 2-$1^{st}$ exposed upper surface ETS2-1 such that a 2-$2^{nd}$ area (or size) A2-2 of the 2-$2^{nd}$ exposed upper surface ETS2-2 is different from a 2-$1^{st}$ area (or size) A2-1 of the 2-$1^{st}$ exposed upper surface ETS2-1.

When the 2-$2^{nd}$ area (or size) A2-2 of the 2-$2^{nd}$ exposed upper surface ETS2-2 is different from the 2-$1^{st}$ area (or size) A2-1 of the 2-$1^{st}$ exposed upper surface ETS2-1, even when substantially the same quantities of materials for forming the emission layers are supplied to the 2-$1^{st}$ exposed upper surface ETS2-1 and the 2-$2^{nd}$ exposed upper surface ETS2-2, the 2-$1^{st}$ emission layer and the 2-$2^{nd}$ emission layer that are formed may have different thicknesses. Consequently, even when the same electrical signals are applied to the 2-$1^{st}$ pixel and the 2-$2^{nd}$ pixel, the 2-$1^{st}$ pixel and the 2-$2^{nd}$ pixel may have different brightnesses. Thus, even when the same nozzle is used to form the 2-$1^{st}$ emission layer of the 2-$1^{st}$ pixel PX2-1 and the 2-$2^{nd}$ emission layer of the 2-$2^{nd}$ pixel, the 2-$1^{st}$ pixel PX2-1 and the 2-$2^{nd}$ pixel PX2-2 being in the same column, each of the pixels in the corresponding column may emit light of a slightly different brightness when the same electrical signals are applied to the pixels. As a result, it is possible to minimize or effectively prevent a phenomenon in which stripes are generated in the columns.

As described above, the pixel-defining layer 150 may define the 2-$2^{nd}$ exposed upper surface ETS2-2 and the 2-$1^{st}$ exposed upper surface ETS2-1 such that the 2-$2^{nd}$ area (or size) A2-2 of the 2-$2^{nd}$ exposed upper surface ETS2-2 is different from the 2-$1^{st}$ area (or size) A2-1 of the 2-$1^{st}$ exposed upper surface ETS2-1. Furthermore, the pixel-defining layer 150 may define a 2-$3^{rd}$ exposed upper surface ETS2-3 such that a 2-$3^{rd}$ area (or size) A2-3 of the 2-$3^{rd}$ exposed upper surface ETS2-3 is different from the 2-$1^{st}$ area (or size) A2-1 of the 2-$1^{st}$ exposed upper surface ETS2-1 and the 2-$2^{nd}$ area (or size) A2-2 of the 2-$2^{nd}$ exposed upper surface ETS2-2. For example, the 2-$2^{nd}$ area (or size) A2-2 may be less than the 2-$1^{st}$ area (or size) A2-1, and the 2-$3^{rd}$ area (or size) A2-2 A2-3 may be greater than the 2-$1^{st}$ area (or size) A2-1. When the areas (or sizes) of the exposed upper surfaces of the three pixels, which emit light of the second wavelength range, are different from one another as described above, pixels including the three pixels, located in one column, may emit light of slightly different brightnesses when the same electrical signals are applied to the pixels. Thus, it is possible to minimize or effectively prevent the phenomenon in which stripes are generated in the columns.

Figure 5:
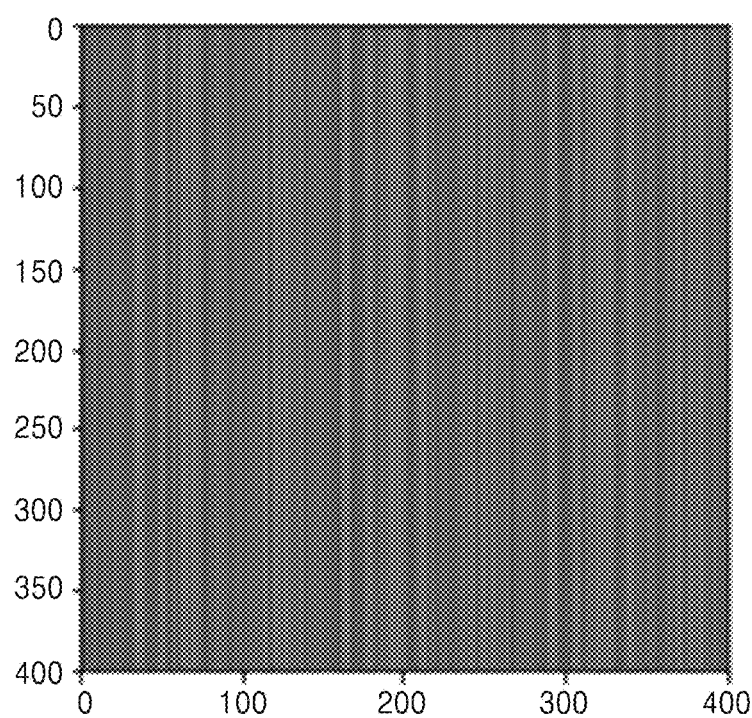
FIG. 5 is a photograph showing a case in which an organic light-emitting display apparatus according to the conventional art emits only in green pixels.

FIG. 5 is a photograph showing a case in which only green pixels emit light in an organic light-emitting display apparatus according to the conventional art. Numbers of the horizontal axis and the vertical axis in FIG. 5 are numbers to specify a location of a pixel in a display area. FIG. 5 illustrates the case in which the same electrical signals are applied to the green pixels to allow the green pixels to emit light of substantially the same brightness. However, as shown in FIG. 5, vertical stripes are shown in a green image displayed by the organic light-emitting display apparatus.

The vertical stripes are a phenomenon caused by the difference between the thickness of emission layers in one column and the thickness of emission layers in a column adjacent to the one column. When a green emission layer is formed by an inkjet printing method in a process of manufacturing an organic light-emitting display apparatus, nozzles may be relatively moved toward a substrate or the substrate may be relatively moved toward the nozzles, in a direction of the vertical axis (e.g., the column direction) in FIG. 5. Thus, emission layers of green pixels located in one column, the emission layers being formed by the same nozzle, may have substantially the same thicknesses. However, because errors in the amount of deposition may occur, the thicknesses of the emission layers of the green pixels in the one column may become different from thicknesses of emission layers of the green pixels in an adjacent column. This is because although the emission layers of the green pixels in each column are formed by using materials injected by the same nozzle, the nozzles for forming the emission layers of the green pixels may be different between the columns.

Figure 6:
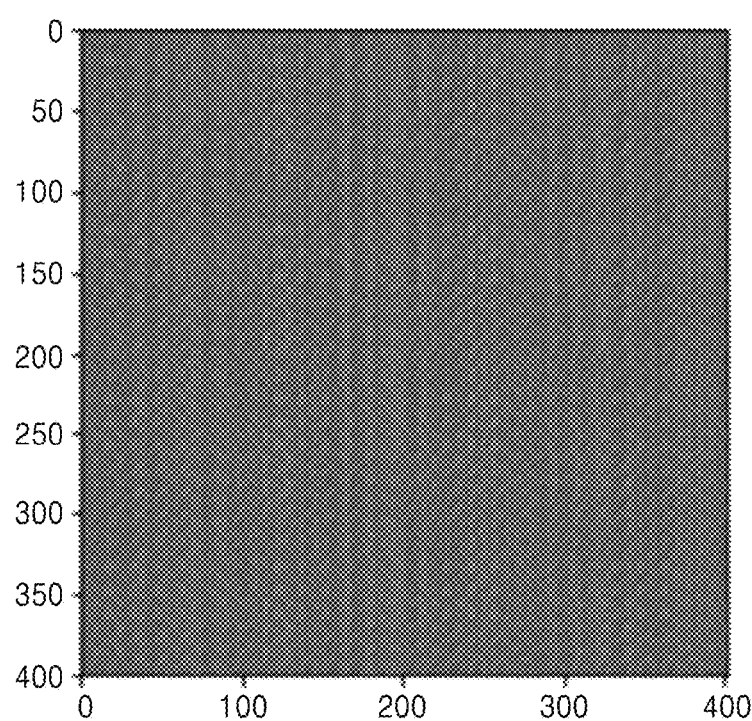
FIG. 6 is a photograph showing a case in which the organic light-emitting display apparatus of FIG. 1 emits only in green pixels.

However, in the case of the organic light-emitting display apparatus having the structure described above according to the illustrated exemplary embodiment, stripes as shown in FIG. 5 are not generated in a photograph of FIG. 6, which indicates the case in which only green pixels emit light. Accordingly, unlike the organic light-emitting display apparatus according to the conventional art, high-quality images may be displayed by minimizing or preventing the stripes in the columns.

A ratio of the 1-$2^{nd}$ area A1-2 to the 1-$1^{st}$ area A1-1 may be substantially the same as a ratio of the 2-$2^{nd}$ area (or size)

A2-2 to the 2-1$^{st}$ area (or size) A2-1. Through this configuration, it is possible to minimize the color imbalance between the light of the wavelengths in the first wavelength range, for example, the red light, and the light of the wavelengths in the second wavelength range, for example, the green light. Likewise, a ratio of the 1-1$^{st}$ area (or size) A1-1 to the 1-3$^{rd}$ area (or size) A1-3 may be substantially the same as a ratio of the 2-1$^{st}$ area (or size) A2-1 to the 2-3$^{rd}$ area (or size) A2-3.

Furthermore, the percentage of increase in the size of the 1-2$^{nd}$ area (or size) A1-2 to the 1-1$^{st}$ area (or size) A1-1 may be substantially the same as the percentage of increase in the size of the 1-1$^{st}$ area (or size) A1-1 to the 1-3$^{rd}$ area (or size) A1-3. Through this configuration, the brightness deviation in the 1-1$^{st}$ pixel PX1-1, the 1-2$^{nd}$ pixel PX1-2, and the 1-3$^{rd}$ pixel PX1-3, corresponding to one column, may be adjusted to be constant. Thus, the general quality of image display may be improved.

As described so far, in the case of the pixels arranged to be adjacent to each other in an x-axis direction in FIG. 2 among pixels emitting the light having a wavelength belonging to the same wavelength range, portions of the pixel electrodes, the portions not being covered by the pixel-defining layer 150 and exposed, may have different areas. Also, in the case of the pixels in a y-axis direction in FIG. 2 among pixels emitting the light having a wavelength belonging to the same wavelength range, portions of the pixel electrodes, the portions not being covered by the pixel-defining layer 150 and exposed, may have different areas (or sizes). For example, FIG. 2 illustrates that the 1-2$^{nd}$ pixel electrode 312 located at an upper left side has the 1-2$^{nd}$ exposed upper surface ETS1-2, and the 1-3$^{rd}$ pixel electrode 313 has the 1-3$^{rd}$ exposed upper surface ETS1-3, wherein the 1-3$^{rd}$ pixel electrode 313 is adjacent to the 1-2$^{nd}$ pixel electrode 312 in the y-axis direction among pixel electrodes corresponding to pixels emitting light having a wavelength belonging to the same wavelength range. Here, the 1-2$^{nd}$ exposed upper surface ETS1-2 and the 1-3$^{rd}$ exposed upper surface ETS1-3 may be different from each other. When a display apparatus has this structure, the general quality of image display may be improved.

According to the principles of the invention, it is also possible to form portions of the pixel electrodes, the portions not being covered by the pixel-defining layer 150 and exposed, with different areas (or sizes), in the case of pixels to emit light in different wavelength ranges in the y-axis direction. For example, FIG. 2 illustrates that the 1-2$^{nd}$ pixel electrode 312 located at the upper left side has the 1-2$^{nd}$ exposed upper surface ETS1-2 including the center of an upper surface, and the 2-3$^{rd}$ pixel electrode 323 has the 2-3$^{rd}$ exposed upper surface ETS2-3 including the center of an upper surface, wherein the 2-3$^{rd}$ pixel electrode 323 is adjacent to the 1-2$^{nd}$ pixel electrode 312 in the y-axis direction and corresponds to the 2-3$^{rd}$ pixel to emit light of a different wavelength range from the 1-2$^{nd}$ pixel PX1-2 corresponding to the 1-2$^{nd}$ pixel electrode 312. Here, the 2-2$^{nd}$ 1-2$^{nd}$ area (or size) A1-2 of the 1-2$^{nd}$ exposed upper surface ETS1-2 and the 2-3$^{rd}$ area (or size) A2-3 of the 2-3$^{rd}$ exposed upper surface ETS2-3 may be different from each other.

Descriptions have been given with respect to the pixels to emit a red light and located in the columns indicated as R in FIG. 2 and the pixels to emit a green light and located in the columns indicated as G in FIG. 2. However, the descriptions may be applied to pixels to emit a blue light and located in the columns indicated as B in FIG. 2.

A display apparatus according to another exemplary embodiment will be described by referring to FIGS. 1A, 1B, and 2. The display apparatus according to the illustrated exemplary embodiment may include a plurality of first pixel electrodes 311, 312, and 313, the pixel-defining layer 150, first emission layers 311a, 312a, and 313a, and the opposite electrode 303, which are located on the substrate 100. The pixel-defining layer 150 may cover an edge of each of the plurality of first pixel electrodes 311, 312, and 313, to define the first exposed upper surfaces ETS1-1, ETS1-2, and ETS1-3 of the plurality of first pixel electrodes 311, 312, and 313, wherein each of the first exposed upper surfaces ETS1-1, ETS1-2, and ETS1-3 includes the center of an upper surface. The first emission layers 311a, 312a, and 313a may be located on the plurality of first pixel electrodes 311, 312, and 313 and may generate light of wavelengths in a first wavelength range. The opposite electrode 303 may be located on the first emission layers 311a, 312a, and 313a.

Here, one or more of the first exposed upper surfaces ETS1-1, ETS1-2, and ETS1-3 may have a 1-1$^{st}$ area A1-1, and another or others of the first exposed upper surfaces ETS1-1, ETS1-2, and ETS1-3 may have a 1-2$^{nd}$ area (or size) A1-2 which is different from the 1-1$^{st}$ area (or size) A1-1. For example, the 1-2$^{nd}$ area (or size) A1-2 may be less than the 1-1$^{st}$ area (or size) A1-1. In addition, locations of the one or more of the first exposed upper surfaces ETS1-1, ETS1-2, and ETS1-3 having the 1-1$^{st}$ area (or size) A1-1, and locations of the another or others having the 1-2$^{nd}$ area (or size) A1-2 may be randomly distributed.

The first emission layers 311a, 312a, and 313a may be formed by an inkjet printing method. However, the amount of a material injected by each of nozzles used for the inkjet printing method may not be substantially the same as each other. Ideally, nozzles may be able to inject substantially the same pre-defined quantities of materials. However, in the practical account, there may be errors in the amount of injection. When the amounts of injection of the nozzles are different, the emission layers may have different thicknesses, and when the emission layers have different thicknesses, brightnesses of the emission layers may be different even when the same electrical signals are applied to the emission layers.

FIG. 3 is a photograph showing a case in which only red pixels emit light in an organic light-emitting display apparatus according to the conventional art. Numbers of the horizontal axis and the vertical axis in FIG. 3 are numbers to specify a location of a pixel in a display area. FIG. 3 illustrates the case in which the same electrical signals are applied to the red pixels to allow the red pixels to emit light of the same brightness. However, as shown in FIG. 3, vertical stripes are shown in a red image displayed by the organic light-emitting display apparatus.

The vertical stripes are a phenomenon caused by the difference between the thickness of emission layers in one column and the thickness of emission layers in a column adjacent to the one column. When a red emission layer is formed by an inkjet printing method in a process of manufacturing an organic light-emitting display apparatus, nozzles may be relatively moved toward a substrate or the substrate may be relatively moved toward the nozzles, in a direction of the vertical axis (e.g., the column direction) in FIG. 3. Thus, emission layers of the red pixels located in one column, the emission layers being formed by the same nozzle, may have substantially the same thicknesses. However, errors in the amount of injection may occur, and the thicknesses of the emission layers of the red pixels in the column may become different from thicknesses of emission layers of the red pixels in an adjacent column. This is because although the emission layers of the red pixels in each column are formed by using materials injected by the same nozzle, the nozzles for forming the emission layers of the red pixels may be different between the columns.

However, in the case of the organic light-emitting display apparatus according to the illustrated exemplary embodiment, stripes as shown in FIG. 3 are not shown in the photograph of FIG. 4, which indicates the case in which only red pixels emit light. This may be because one or more of the first exposed upper surfaces ETS1-1, ETS1-2, and ETS1-3 have the 1-$1^{st}$ area (or size) A1-1 and the another or others of the first exposed upper surfaces ETS1-1, ETS1-2, and ETS1-3 have the 1-$2^{nd}$ area (or size) A1-2, which is different from the 1-$1^{st}$ area (or size) A1-1, and the locations of the one or more of the first exposed upper surfaces ETS1-1, ETS1-2, and ETS1-3 having the 1-$1^{st}$ area (or size) A1-1, and the locations of the another or others having the 1-$2^{nd}$ area (or size) A1-2 may be randomly distributed.

Even in the case of the pixels located in the same column, one or more of the pixels may have the 1-$1^{st}$ area (or size) A1-1 and the another or others may have the 1-$2^{nd}$ area (or size) A1-2, which is different from the 1-$1^{st}$ area (or size) A1-1. Thus, even in the case of the pixels located in the same column, the pixels having the emission layers formed by the same nozzle, brightnesses of the pixels may become slightly different even when the same electrical signals are applied to the pixels. In particular, in the case of a plurality of columns, because the locations of one or more of the first exposed upper surfaces ETS1-1, ETS1-2, and ETS1-3, the one or more having the 1-$1^{st}$ area (or size) A1-1, and the locations of the another or others having the 1-$2^{nd}$ area (or size) A1-2 may be randomly distributed, stripes may not be generated throughout the display area and a high-quality image may be displayed.

One or more of the first exposed upper surfaces ETS1-1, ETS1-2, and ETS1-3 may have the 1-$1^{st}$ area (or size) A1-1, another or others of the first exposed upper surfaces ETS1-1, ETS1-2, and ETS1-3 may have the 1-$2^{nd}$ area (or size) A1-2, which is different from the 1-$1^{st}$ area (or size) A1-1, and yet another or others of the first exposed upper surfaces ETS1-1, ETS1-2, and ETS1-3 may have a 1-$3^{rd}$ area (or size) A1-3, which is different from the 1-$1^{st}$ area (or size) A1-1 and the 1-$2^{nd}$ area (or size) A1-2. Also, in this case, locations of one or more of the first exposed upper surfaces ETS1-1, ETS1-2, and ETS1-3 having the 1-$1^{st}$ area (or size) A1-1, locations of another or others of the first exposed upper surfaces ETS1-1, ETS1-2, and ETS1-3 having the 1-$2^{nd}$ area (or size) A1-2, and locations of yet another or others of the first exposed upper surfaces ETS1-1, ETS1-2, and ETS1-3 having the 1-$3^{rd}$ area (or size) A1-3, may be randomly distributed, and thus, stripes may not be generated throughout the display area and a high-quality image may be displayed.

The organic light-emitting display apparatus according to the illustrated exemplary embodiment may include a plurality of second pixel electrodes 321, 322, and 323 located on the substrate 100, and second emission layers located on the second pixel electrodes 321, 322, and 323, wherein the second emission layers generate light of wavelengths in a second wavelength range. The light of the wavelengths in the second wavelength range may be, for example, a green light. Here, the pixel-defining layer 150 may cover an edge of each of the plurality of second pixel electrodes 321, 322, and 323, to define second exposed upper surfaces ETS2-1, ETS2-2, and ETS2-3 of the plurality of second pixel electrodes 321, 322, and 323, wherein each of the second exposed upper surfaces ETS2-1, ETS2-2, and ETS2-3 includes center of an upper surface.

Here, one or more of the second exposed upper surfaces ETS2-1, ETS2-2, and ETS2-3 may have a 2-$1^{st}$ area (or size) A2-1, and another or others of the second exposed upper surfaces ETS2-1, ETS2-2, and ETS2-3 may have a 2-$2^{nd}$ area (or size) A2-2, which is different from the 2-$1^{st}$ area (or size) A2-1. For example, the 2-$2^{nd}$ area (or size) A2-2 may be less than the 2-$1^{st}$ area (or size) A2-1. In addition, locations of the one or more of the second exposed upper surfaces ETS2-1, ETS2-2, and ETS2-3 having the 2-$1^{st}$ area (or size) A2-1, and the locations of the another or others of the second exposed upper surfaces ETS2-1, ETS2-2, and ETS2-3 having the 2-$2^{nd}$ area (or size) A2-2 may be randomly distributed. Through this configuration, even when the second emission layers are formed by the inkjet printing method, unlike the organic light-emitting display apparatus according to the conventional art, which generates the stripes as shown in FIG. 5, a high-quality image without stripes as shown in FIG. 6 may be displayed.

One or more of the second exposed upper surfaces ETS2-1, ETS2-2, and ETS2-3 may have the 2-$1^{st}$ area (or size) A2-1, another or others of the second exposed upper surfaces ETS2-1, ETS2-2, and ETS2-3 may have the 2-$2^{nd}$ area (or size) A2-1, which is different from the 2-$1^{st}$ area (or size) A2-1, and yet another or others of the second exposed upper surfaces ETS2-1, ETS2-2, and ETS2-3 may have the 2-$3^{rd}$ area (or size) A2-3, which is different from the 2-$1^{st}$ area (or size) A2-1 and the 2-$2^{nd}$ area (or size) A2-2. Also, in this case, locations of the one or more of the second exposed upper surfaces ETS2-1, ETS2-2, and ETS2-3 having the 2-$1^{st}$ area (or size) A2-1, locations of the another or others having the 2-$2^{nd}$ area (or size) A2-2, and locations of yet another or others having the 2-$3^{rd}$ area (or size) A2-3 may be randomly distributed, and thus, stripes may not be generated throughout the display area and a high-quality image may be displayed.

A ratio of the 1-$2^{nd}$ area (or size) A1-2 to the 1-$1^{st}$ area (or size) A1-1 may be substantially the same as a ratio of the 2-$2^{nd}$ area (or size) A2-2 to the 2-$1^{st}$ area (or size) A2-1. Through this configuration, it is possible to minimize the color imbalance between the light of the wavelengths in the first wavelength range, for example, the red light, and the light of the wavelengths in the second wavelength range, for example, the green light.

Figure 7B:
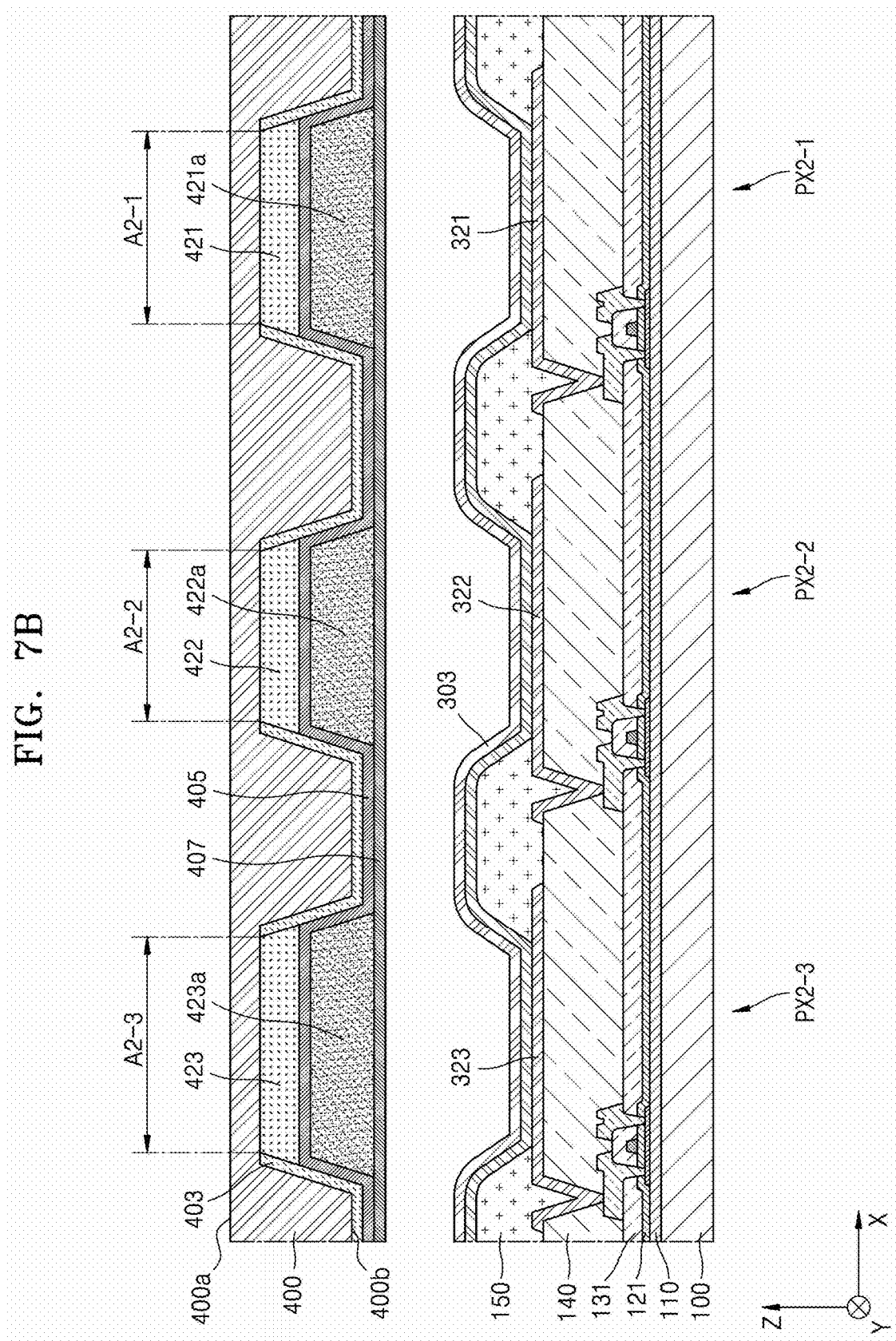
Figure 8:
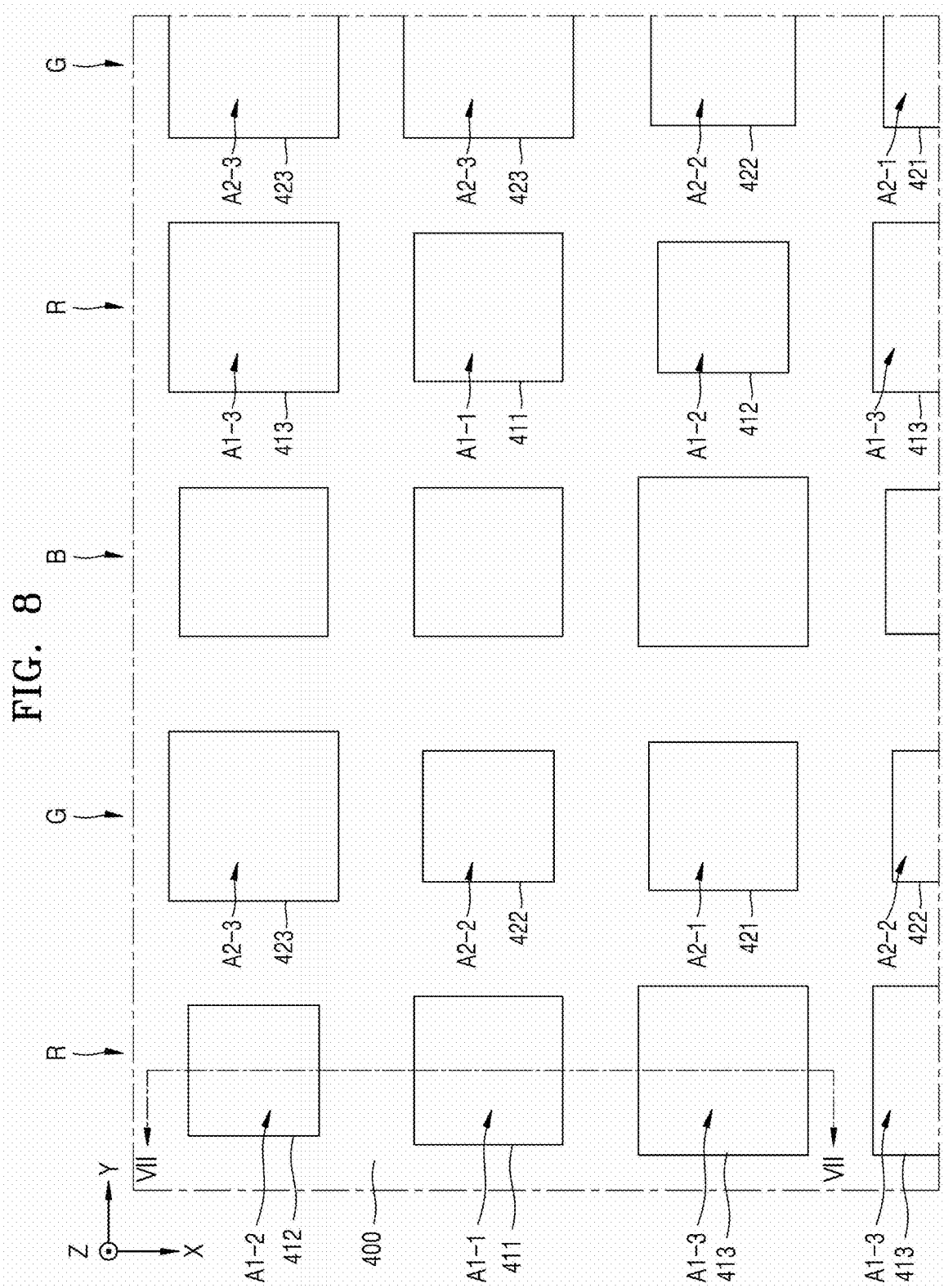
FIG. 8 is a schematic plan view of a portion of the organic light-emitting display apparatus of FIGS. 7A and 7B.

The descriptions above are given with respect to the organic light-emitting display apparatus. However, exemplary embodiments are not limited thereto. The exemplary embodiments may also include a display apparatus illustrated in FIGS. 7A, 7B, and 8, wherein FIGS. 7A and 7B are schematic cross-sectional views of portions of another exemplary embodiments of an organic light-emitting display apparatus constructed according to the principles of the invention, and FIG. 8 is a schematic plan view of a portion of the organic light-emitting display apparatus of FIGS. 7A and 7B. FIG. 7A may be understood as the cross-sectional view of the organic light-emitting display apparatus, which is taken along a line VII-VII of FIG. 8. Hereinafter, components corresponding to the components described with reference to FIGS. 1A, 1B, and 2 will not be described for convenience.

FIG. 7A, for convenience of description, schematically illustrates a portion of each of three pixels of the organic light-emitting display apparatus. Unlike the illustration in FIG. 7A, components of thin-film transistors may not be located in the cross-section plane (e.g., the same z-x plane). For example, at least one of the 1-$2^{nd}$ gate electrode 212b, the 1-2$^{nd}$ source electrode 212c, and the 1-2$^{nd}$ drain electrode 212d of the 1-2$^{nd}$ thin-film transistor 212 may not be located in the same z-x plane. Various modifications are possible. For example, only the 1-2$^{nd}$ gate electrode 212b and the 1-2$^{nd}$ source electrode 212c may be located in the same z-x plane, and the 1-2$^{nd}$ drain electrode 212d may not be located in the same z-x plane.

In the organic light-emitting display apparatus according to the illustrated exemplary embodiment, a plurality of pixels may be located in a display area, as illustrated in FIG. 7A. For reference, it is illustrated in FIG. 7A that the 1-1$^{st}$ thin-film transistor 211 is located in the 1-1$^{st}$ pixel PX1-1, the 1-2$^{nd}$ thin-film transistor 212 is located in the 1-2$^{nd}$ pixel PX1-2, and the 1-3$^{rd}$ thin-film transistor 213 is located in the 1-3$^{rd}$ pixel PX1-3. Accordingly, it is illustrated that the 1-1$^{st}$ pixel electrode 311 located in the 1-1$^{st}$ pixel PX1-1 is electrically connected to the 1-1$^{st}$ thin-film transistor 211, the 1-2$^{nd}$ pixel electrode 312 located in the 1-2$^{nd}$ pixel PX1-2 is electrically connected to the 1-2$^{nd}$ thin-film transistor 212, and the 1-3$^{rd}$ pixel electrode 313 located in the 1-3$^{rd}$ pixel PX1-3 is electrically connected to the 1-3$^{rd}$ thin-film transistor 213.

The 1-1$^{st}$ pixel PX1-1, the 1-2$^{nd}$ pixel PX1-2, and the 1-3$^{rd}$ pixel PX1-3 may emit light of wavelengths belonging to the substantially same wavelength range. For example, the 1-1$^{st}$ pixel PX1-1, the 1-2$^{nd}$ pixel PX1-2, and the 1-3$^{rd}$ pixel PX1-3 may emit light of wavelengths belonging to a third wavelength range. This may be applied to other pixels. The third wavelength range may be between about 450 nm and about 495 nm. However, exemplary embodiments are not limited thereto. The third wavelength range may be different from the wavelength range described above.

In a display area of the substrate 100, the 1-1$^{st}$ pixel electrode 311 and the 1-2$^{nd}$ pixel electrode 312 may be located on the planarization layer 140. The 1-1$^{st}$ pixel electrode 311 on the planarization layer 140 may contact any one of the 1-1$^{st}$ source electrode 211c and the 1-1$^{st}$ drain electrode 211d through an opening in the planarization layer 140 or the like as illustrated in FIG. 7A and may be electrically connected to the 1-1$^{st}$ thin-film transistor 211. Likewise, the 1-2$^{nd}$ pixel electrode 312 on the planarization layer 140 may contact any one of the 1-2$^{nd}$ source electrode 212c and the 1-2$^{nd}$ drain electrode 212d through an opening in the planarization layer 140 or the like and may be electrically connected to the 1-2$^{nd}$ thin-film transistor 212.

The organic light-emitting display apparatus according to the illustrated exemplary embodiment may be a top-emission-type display apparatus, which emits light to the outside via the opposite electrode 303. Thus, the 1-1$^{st}$, 1-2$^{nd}$, and 1-3$^{rd}$ pixel electrodes 311, 312, and 313 may be formed by including a metal material, which has a high reflectivity, such as a stack of Al and Ti (e.g., Ti/Al/Ti), a stack of Al and ITO (e.g., ITO/Al/ITO), a stack of Ag and ITO (e.g., ITO/Ag/ITO), an Ag, Pd, and Cu (APC) alloy, a stack of an APC alloy and ITO (e.g., ITO/APC/ITO), or the like. The APC alloy may be an Ag, Pd, and/or Cu alloy.

The pixel-defining layer 150 may be arranged on the planarization layer 140. The pixel-defining layer 150 may have openings overlapping sub-pixels, respectively, thereby defining a pixel. For example, the pixel-defining layer 150 may cover an edge of the 1-1$^{st}$ pixel electrode 311, an edge of the 1-2$^{nd}$ pixel electrode 312, and an edge of the 1-3$^{rd}$ pixel electrode 313. The pixel-defining layer 150 may prevent an arc, etc. from occurring, for example, at the edge of the 1-1$^{st}$ pixel electrode 311, by increasing a distance between the edge of the 1-1$^{st}$ pixel electrode 311 and the opposite electrode 303 above the 1-1$^{st}$ pixel electrode 311 or the like.

An intermediate layer 310 including an emission layer may be integrally formed as a single unitary member on the 1-1$^{st}$, 1-2$^{nd}$, and 1-3$^{rd}$ pixel electrodes 311, 312, and 313, and the opposite electrode 303 on the intermediate layer 310 may be integrally formed as a single unitary member throughout the 1-1$^{st}$, 1-2$^{nd}$, and 1-3$^{rd}$ pixel electrodes 311, 312, and 313.

The intermediate layer 310 may include a low molecular weight material or a high molecular weight material. When the intermediate layer 310 includes a low molecular weight material, the intermediate layer 310 may be formed by an inkjet printing method or a vapor deposition method. When the intermediate layer 310 includes a high molecular weight material, the intermediate layer 310 may be formed by screen printing, inkjet printing, deposition, laser induced thermal imaging (LITI), or the like.

The intermediate layer 310 may include a layer that is integrally formed as a single unitary member throughout the 1-1$^{st}$, 1-2$^{nd}$, and 1-3$^{rd}$ pixel electrodes 311, 312, and 313 as described above. However, according to necessity, the intermediate layer 310 may include layers patterned to respectively correspond to the 1-1$^{st}$, 1-2$^{nd}$, and 1-3$^{rd}$ pixel electrodes 311, 312, and 313. In both cases, the intermediate layer 310 may include the emission layer capable of emitting light of a wavelength in the third wavelength range. The emission layer may be a single unitary member integrally formed throughout the 1-1$^{st}$, 1-2$^{nd}$, and 1-3$^{rd}$ pixel electrodes 311, 312, and 313. According to necessity, the emission layer may be patterned to correspond to each of the 1-1$^{st}$, 1-2$^{nd}$, and 1-3$^{rd}$ pixel electrodes 311, 312, and 313.

The opposite electrode 303 may be arranged to cover the display area. For example, the opposite electrode 303 may be integrally formed as a single unitary member throughout a plurality of organic light-emitting devices and may correspond to the plurality of pixel electrodes 311, 312, and 313. Because the organic light-emitting display apparatus according to the illustrated exemplary embodiment is a top-emission-type display apparatus, the opposite electrode 303 may include a TCO, such as ITO or IZO, which permits light transmission, or a semi-transmissive conductive material, such as Mg, Ag, or an alloy of Mg and Ag.

The organic light-emitting device may be vulnerable to external moisture or oxygen, and thus, may be protected by being covered by an encapsulation layer. The encapsulation layer may cover the display area and extend to at least a portion of the peripheral area. The encapsulation layer may include a first inorganic encapsulation layer, an organic encapsulation layer, and a second inorganic encapsulation layer.

An upper substrate 400 may be located above the substrate 100, so that the opposite electrode 303 may be arranged between the upper substrate 400 and the substrate 100. The upper substrate 400 may include glass, metal, or polymer resins. In the case where the upper substrate 400 is flexible or bendable, the upper substrate 400 may include polymer resins, such as polyethersulphone, polyacrylate, polyetherimide, polyethylene naphthalate, polyethylene terephthalate, polyphenylene sulfide, polyarylate, polyimide, polycarbonate, or cellulose acetate propionate. However, various modifications may be possible. For example, the upper substrate 400 may have a multi-layered structure of two layers each including the polymer resins described above, and a barrier layer between the two layers that includes an inorganic material, such as silicon oxide, silicon nitride, silicon oxynitride, etc.

The upper substrate 400 may include 1-$1^{st}$, 1-$2^{nd}$, and 1-$3^{rd}$ grooves in a lower surface 400b in a direction toward the substrate 100 (e.g., a negative z-axis direction). The 1-$1^{st}$ 1-$2^{nd}$, and 1-$3^{rd}$ grooves may correspond to the 1-$1^{st}$, 1-$2^{nd}$, and 1-$3^{rd}$ pixel electrodes 311, 312, and 313. That the 1-$1^{st}$, 1-$2^{nd}$, and 1-$3^{rd}$ grooves correspond to the 1-$1^{st}$, 1-$2^{nd}$, and 1-$3^{rd}$ pixel electrodes 311, 312, and 313 may denote that, when viewed in a direction that is perpendicular to the upper substrate 400 (e.g., a z-axis direction), the 1-$1^{st}$ groove overlaps the 1-$1^{st}$ pixel electrode 311, the 1-$2^{nd}$ groove overlaps the 1-$2^{nd}$ pixel electrode 312, and the 1-$3^{rd}$ groove overlaps the 1-$3^{rd}$ pixel electrode 313. Here, the area (or size) of a lower surface of the 1-$1^{st}$ groove in a positive z direction may be different from the area of a lower surface (of the positive z direction) of the 1-$2^{nd}$ groove in the positive z direction.

An inner surface of each of the 1-$1^{st}$, 1-$2^{nd}$, and 1-$3^{rd}$ grooves of the upper substrate 400 may be inclined with respect to the lower surface 400b of the upper substrate 400. Here, the area (or size) of a cross-section of each of the 1-$1^{st}$, 1-$2^{nd}$, and 1-$3^{rd}$ grooves, based on a virtual plane (e.g., an x-y plane) that is parallel to the lower surface 400b of the upper substrate 400, may decrease from the lower surface 400b to an upper surface 400a of the upper substrate 400.

A reflection layer 403 may be located in the 1-$1^{st}$, 1-$2^{nd}$, and 1-$3^{rd}$ grooves. In detail, the reflection layer 403 may be located in the inner surface of the 1-$1^{st}$, 1-$2^{nd}$, and 1-$3^{rd}$ grooves. The reflection layer 403 may include a reflective metal, such as Al or Ag. However, the reflection layer 403 may not only be located in the 1-$1^{st}$, 1-$2^{nd}$, and 1-$3^{rd}$ grooves as illustrated in FIG. 7A. The reflection layer 403 may also be located on the lower surface 400b of the upper substrate 400, the lower surface 400b being in the direction toward the substrate 100. In detail, the reflection layer 403 may cover portions of the lower surface 400b of the upper substrate 400, the portions being outside the 1-$1^{st}$, 1-$2^{nd}$, and 1-$3^{rd}$ grooves. The reflection layer 403 may not cover at least a portion of each of a 1-$1^{st}$ lower surface of the 1-$1^{st}$ groove in the positive z direction, a 1-$2^{nd}$ lower surface of the 1-$2^{nd}$ groove in the positive z direction, and a 1-$3^{rd}$ lower surface of the 1-$3^{rd}$ groove in the positive z direction.

A 1-$1^{st}$ color filter layer 411 and a 1-$1^{st}$ color quantum dot layer 411a may be located in the 1-$1^{st}$ groove. A 1-$2^{nd}$ color filter layer 412 and a 1-$2^{nd}$ color quantum dot layer 412a may be located in the 1-$2^{nd}$ groove. A 1-$3^{rd}$ color filter layer 413 and a 1-$3^{rd}$ color quantum dot layer 413a may be located in the 1-$3^{rd}$ groove. However, 2-$1^{st}$, 2-$2^{nd}$, and 2-$3^{rd}$ color filter layers and 2-$1^{st}$, 2-$2^{nd}$, and 2-$3^{rd}$ color quantum dot layers may be located in 2-$1^{st}$, 2-$2^{nd}$, and 2-$3^{rd}$ grooves overlapping 2-$1^{st}$, 2-$2^{nd}$, and 2-$3^{rd}$ pixels, in addition to the 1-$1^{st}$, 1-$2^{nd}$, and 1-$3^{rd}$ pixels PX1-1, PX1-2, and PX1-3. In addition, 3-$1^{st}$ 3-$2^{nd}$, and 3-$3^{rd}$ color filter layers may be located in 3-$1^{st}$, 3-$2^{nd}$, and 3-$3^{rd}$ grooves overlapping 3-$1^{st}$, 3-$2^{nd}$, and 3-$3^{rd}$ pixels. Meanwhile, a first protection layer 405 may be interposed between the 1-$1^{st}$, 1-$2^{nd}$, and 1-$3^{rd}$ color filter layers 411, 412, and 413 and the 1-$1^{st}$, 1-$2^{nd}$, and 1-$3^{rd}$ color quantum dot layers 411a, 412a, and 413a, and a second protection layer 407 may cover the 1-$1^{st}$, 1-$2^{nd}$, and 1-$3^{rd}$ color quantum dot layers 411a, 412a, and 413".

The 1-$1^{st}$, 1-$2^{nd}$, and 1-$3^{rd}$ color filter layers 411, 412, and 413 may transmit only light of wavelengths belonging to a first wavelength range. For example, the first wavelength range may be between about 630 nm and about 780 nm. The 2-$1^{st}$, 2-$2^{nd}$, and 2-$3^{rd}$ color filter layers may transmit only light of wavelengths belonging to a second wavelength range. For example, the second wavelength range may be between about 495 nm and about 570 nm. The 3-$1^{st}$, 3-$2^{nd}$ and 3-$3^{rd}$ color filter layers may transmit only light of wavelengths belonging to a third wavelength range. For example, the third wavelength range may be between about 450 nm and about 495 nm. However, exemplary embodiments are not limited thereto. The first, second, and third wavelength ranges may be different from the wavelength ranges described above.

The 1-$1^{st}$, 1-$2^{nd}$, and 1-$3^{rd}$ color filter layers 411, 412, and 413, the 2-$1^{st}$, 2-$2^{nd}$, and 2-$3^{rd}$ color filter layers, and the 3-$1^{st}$, 3-$2^{nd}$, and 3-$3^{rd}$ color filter layers may reduce reflection of external light in the organic light-emitting display apparatus. For example, when external light reaches the 1-$1^{st}$, 1-$2^{nd}$, and 1-$3^{rd}$ color filter layers 411, 412, and 413, only the light of the pre determined wavelengths as described above may be transmitted through the 1-$1^{st}$, 1-$2^{nd}$, and 1-$3^{rd}$ color filter layers 411, 412, and 413, and light of other wavelengths may be absorbed by the 1-$1^{st}$, 1-$2^{nd}$, and 1-$3^{rd}$ color filter layers 411, 412, and 413. Thus, of the external light that is incident into the organic light-emitting display apparatus, only the light of the pre-determined wavelengths described above may be transmitted through the 1-$1^{st}$, 1-$2^{nd}$, and 1-$3^{rd}$ color filter layers 411, 412, and 413. Also, portions of the light of the pre-determined wavelengths may be reflected from the opposite electrode 303 or the 1-$1^{st}$, 1-$2^{nd}$, and 1-$3^{rd}$ pixel electrodes 311, 312, and 313, below the 1-$1^{st}$, 1-$2^{nd}$, and 1-$3^{rd}$ color filter layers 411, 412, and 413, and emitted again to the outside. Accordingly, since only portions of the external light that is incident to the locations of the 1-$1^{st}$ pixel PX1-1, the 1-$2^{nd}$ pixel PX1-2, and the 1-$3^{rd}$ pixel PX1-3 are reflected to the outside, reflection of the external light may be reduced. This description may be applied to the 2-$1^{st}$, 2-$2^{nd}$, and 2-$3^{rd}$ color filter layers and the 3-$1^{st}$, 3-$2^{nd}$, and 3-$3^{rd}$ color filter layers.

The 1-$1^{st}$, 1-$2^{nd}$, and 1-$3^{rd}$ color quantum dot layers 411a, 412a, and 413a may convert the light of the third wavelength range, which is generated by the intermediate layer 310 on the 1-$1^{st}$, 1-$2^{nd}$, and 1-$3^{rd}$ pixel electrodes 311, 312, and 313, into the light of the first wavelength range. For example, when light of the wavelength range between about 450 nm and about 495 nm is generated by the intermediate layer 310 on the 1-$1^{st}$, 1-$2^{nd}$, and 1-$3^{rd}$ pixel electrodes 311, 312, and 313, the 1-$1^{st}$, 1-$2^{nd}$, and 1-$3^{rd}$ color quantum dot layers 411a, 412a, and 413a may convert this light into light of the wavelength range between about 630 nm and about 780 nm. Accordingly, the light of the wavelength range between about 630 nm and about 780 nm may be emitted to the outside through the upper substrate 400 in the 1-$1^{st}$, 1-$2^{nd}$, and 1-$3^{rd}$ pixels PX1-1, PX1-2, and PX1-3.

The 2-$1^{st}$, 2-$2^{nd}$, and 2-$3^{rd}$ color quantum dot layers may convert the light of the third wavelength range, which is generated by the intermediate layer 310 on the 2-$1^{st}$, 2-$2^{nd}$, and 2-$3^{rd}$ pixel electrodes, into the light of the second wavelength range. For example, when light of the wavelength range between about 450 nm and about 495 nm is generated by the intermediate layer 310 on the 2-$1^{st}$, 2-$2^{nd}$, and 2-$3^{rd}$ pixel electrodes, the 2-$1^{st}$, 2-$2^{nd}$, and 2-$3^{rd}$ color quantum dot layers may convert this light into light of the wavelength range between about 495 nm and about 570 nm. Accordingly, the light of the wavelength range between about 495 nm and about 570 nm may be emitted to the outside through the upper substrate 400 in the 2-$1^{st}$, 2-$2^{nd}$, and 2-$3^{rd}$ pixels.

Each of the 1-$1^{st}$, 1-$2^{nd}$, and 1-$3^{rd}$ color quantum dot layers 411a, 412a, and 413a and each of the 2-$1^{st}$, 2-$2^{nd}$, and 2-$3^{rd}$ color quantum dot layers may have a shape in which quantum dots are distributed in resins. The quantum dots may include a semiconductor material, such as Cds, CdTe, ZnS, InP, or the like. The quantum dots may have sizes of several nanometers and according to the sizes of the quantum dots, a wavelength of the light may be changed after the conversion. The resins included in the $1\text{-}1^{st}$, $1\text{-}2^{nd}$, and $1\text{-}3^{rd}$ color quantum dot layers 411a, 412a, and 413a and the $2\text{-}1^{st}$, $2\text{-}2^{nd}$, and $2\text{-}3^{rd}$ quantum dot layers may include any transmissive material. For example, polymer resins, such as acryl, BCB, or HMDSO, may be used as a material included in the $1\text{-}1^{st}$, $1\text{-}2^{nd}$, and $1\text{-}3^{rd}$ color quantum dot layers 411a, 412a, and 413a and the $2\text{-}1^{st}$, $2\text{-}2^{nd}$, and $2\text{-}3^{rd}$ color quantum dot layers.

While the $3\text{-}1^{st}$, $3\text{-}2^{nd}$, and $3\text{-}3^{rd}$ color filter layers may be located in the $3\text{-}1^{st}$ $3\text{-}2^{nd}$, and $3\text{-}3^{rd}$ grooves overlapping the $3\text{-}1^{st}$, $3\text{-}2^{nd}$, and $3\text{-}3^{rd}$ pixels, quantum dot layers may not be located in the $3\text{-}1^{st}$, $3\text{-}2^{nd}$, and $3\text{-}3^{rd}$ grooves overlapping the $3\text{-}1^{st}$, $3\text{-}2^{nd}$, and $3\text{-}3^{rd}$ pixels. Accordingly, transmissive layers including transmissive resins may be located in the $3\text{-}1^{st}$ 3-2nd and $3\text{-}3^{rd}$ grooves overlapping the $3\text{-}1^{st}$, $3\text{-}2^{nd}$, and $3\text{-}3^{rd}$ pixels. The transmissive layers may include, for example, BCB or HMDSO. However, in some cases, the transmissive layers may not be located in the grooves overlapping the $3\text{-}1^{st}$, $3\text{-}2^{nd}$, and $3\text{-}3^{rd}$ pixels.

Referring to FIGS. 7A and 7B, in the organic light-emitting display apparatus according to the illustrated exemplary embodiment, the light of the first wavelength range may be emitted to the outside in the $1\text{-}1^{st}$, $1\text{-}2^{nd}$, and $1\text{-}3^{rd}$ pixels PX1-1, PX1-2, and PX1-3, the light of the second wavelength range may be emitted to the outside in the $2\text{-}1^{st}$, $2\text{-}2^{nd}$, and $2\text{-}3^{rd}$ pixels PX2-1, PX2-2, and PX2-3, and the light of the third wavelength range may be emitted to the outside in the $3\text{-}1^{st}$, $3\text{-}2^{nd}$, and $3\text{-}3^{rd}$ pixels. Thus, the organic light-emitting display apparatus according to the illustrated exemplary embodiment may display a full color image.

The $1\text{-}1^{st}$, $1\text{-}2^{nd}$, and $1\text{-}3^{rd}$ color filter layers 411, 412, and 413 may be formed by an inkjet printing method. For example, the $1\text{-}1^{st}$, $1\text{-}2^{nd}$, and $1\text{-}3^{rd}$ color filter layers 411, 412, and 413 may be formed by depositing, via inkjet printing, a material for forming color filter layers in the $1\text{-}1^{st}$, $1\text{-}2^{nd}$, and $1\text{-}3^{rd}$ groove formed in the upper substrate 400. Here, the $1\text{-}1^{st}$, $1\text{-}2^{nd}$, and $1\text{-}3^{rd}$ color filter layers 411, 412, and 413 may be simultaneously formed by using an inkjet printing device having a plurality of nozzles. In this process, because one nozzle may be located in one groove to form a color filter layer, a nozzle for injecting a material for forming the $1\text{-}1^{st}$ color filter layer 411 and a nozzle for injecting a material for forming the $1\text{-}2^{nd}$ color filter layer 412 may be different from each other. In other words, the $1\text{-}1^{st}$ color filter layer 411 and the $1\text{-}2^{nd}$ color filter layer 412 may be formed by different nozzles, because it may be impossible to locate a plurality of nozzles in one groove overlapping each pixel due to the small size of each pixel in a high-resolution display apparatus.

Thus, when forming the $1\text{-}1^{st}$, $1\text{-}2^{nd}$, and $1\text{-}3^{rd}$ color filter layers 411, 412, and 413, the nozzle for injecting the material for forming the $1\text{-}1^{st}$ color filter layer 411 and the nozzle for injecting the material for forming the $1\text{-}2^{nd}$ color filter layer 412 may be different from each other. The amount of injection of the nozzle for injecting the material for forming the $1\text{-}1^{st}$ color filter layer 411 and the amount of injection of the nozzle for injecting the material for forming the $1\text{-}2^{nd}$ color filter layer 412 may not be substantially the same as each other. Ideally, nozzles may be able to inject substantially the same pre-defined quantities of materials. However, in the practical account, there may be errors in the amount of injection. Thus, the quantity of the material injected for forming the $1\text{-}1^{st}$ color filter layer 411 and the quantity of the material injected for forming the $1\text{-}2^{nd}$ color filter layer 412 may become different from each other. This may result in the thickness of the $1\text{-}1^{st}$ color filter layer 411 and the thickness of the $1\text{-}2^{nd}$ color filter layer 412 being different from each other. In this case, after the display apparatus is manufactured, the degrees in which reflection of external light is reduced may become different between the $1\text{-}1^{st}$ pixel PX1-1 and the $1\text{-}2^{nd}$ pixel PX1-2. Also, even when the same electrical signals are applied to the $1\text{-}1^{st}$ pixel PX1-1 and the $1\text{-}2^{nd}$ pixel PX1-2, the $1\text{-}1^{st}$ pixel PX1-1 and the $1\text{-}2^{nd}$ pixel PX1-2 may have different brightnesses from each other. For example, even when only red pixels of a display apparatus emit light of substantially the same brightness, vertical stripes may be generated in a red image that is displayed as illustrated in FIG. 3.

The vertical stripes are a phenomenon caused by the difference between the thickness of color filter layers in one column and the thickness of color filter layers in a column adjacent to the one column. When a red color filter layer is formed by an inkjet printing method in a process of manufacturing a display apparatus, nozzles may be relatively moved toward an upper substrate or the upper substrate may be relatively moved toward the nozzles, in a direction of a vertical axis (e.g., the column direction) in FIG. 3. Thus, color filter layers of red pixels located in one column, the color filter layers being formed by the same nozzle, may have substantially the same thicknesses. However, because errors in the amount of injection may occur, the thicknesses of the color filter layers of the red pixels in the one column may become different from thicknesses of color filter layers of the red pixels in an adjacent column. This is because although the color filter layers of the red pixels of each column are formed by using materials injected by the same nozzle, the nozzles for forming the color filter layers of the red pixels may be different between the columns.

However, in the case of the organic light-emitting display apparatus according to the illustrated exemplary embodiment, stripes as shown in FIG. 3 are not generated in the photograph of FIG. 4, which indicates the case in which only red pixels emit light. Accordingly, unlike display apparatuses according to the conventional art, high-quality images may be displayed.

As described above, in the case of the organic light-emitting display apparatus according to the illustrated exemplary embodiment, the area of the lower surface of the st groove in the positive z direction may be different from the area of the lower $1\text{-}1^{st}$ surface of the $1\text{-}2^{st}$ groove in the positive z direction. Accordingly, a $1\text{-}1^{st}$ area (or size) A1-1, which is the area of an upper surface of the $1\text{-}1^{st}$ color filter layer 411 facing away from the substrate 100, may be different from a $1\text{-}2^{nd}$ area (or size) A1-2, which is the area of an upper surface of the $1\text{-}2^{nd}$ color filter layer 412 facing away from the substrate 100. When the $1\text{-}1^{st}$ area (or size) A1-1 and the $1\text{-}2^{nd}$ area (or size) A1-2 are different from each other, the $1\text{-}1^{st}$ color filter layer 411 and the $1\text{-}2^{nd}$ color filter layer 412 that are formed by supplying substantially the same quantity of materials for forming the color filter layer to the $1\text{-}1^{st}$ groove and the $1\text{-}2^{nd}$ groove may have different thicknesses from each other. Consequently, even when the same electrical signals are applied to the $1\text{-}1^{st}$ pixel PX1-1 and the $1\text{-}2^{nd}$ pixel PX1-2, the $1\text{-}1^{st}$ pixel PX1-1 and the $1\text{-}2^{nd}$ pixel PX1-2 may have different brightnesses. Thus, even when the same nozzle is used to form the $1\text{-}1^{st}$ color filter layer 411 of the $1\text{-}1^{st}$ pixel PX1-1 and the $1\text{-}2^{nd}$ color filter layer 412 of the $1\text{-}2^{nd}$ pixel PX1-2, the $1\text{-}1^{st}$ pixel PX1-1 and the $1\text{-}2^{nd}$ pixel PX1-2 being in the same column, each of the pixels included in the corresponding column may emit light of a slightly different brightness when the same electrical signals are applied to the pixels. As a result, it is possible to minimize or effectively prevent a phenomenon in which stripes are generated in the columns.

As described above, the area (or size) of the lower surface of the 1-1$^{st}$ groove in the positive z direction may be different from the area of the lower surface of the 1-2$^{nd}$ groove in the positive z direction. Further, the area (or size) of a lower surface of the 1-3$^{rd}$ groove in the positive z direction may be different from the area of the lower surface of the 1-1$^{st}$ groove in the positive z direction and the area of the lower surface of the 1-2$^{nd}$ groove in the positive z direction. Accordingly, the 1-3$^{rd}$ area (or size) A1-3, which is the area (or size) of an upper surface of the 1-3$^{rd}$ color filter layer 413 facing away from the substrate 100, may be different from the 1-1$^{st}$ area (or size) A1-1 and the 1-2$^{nd}$ area (or size) A1-2. For example, the 1-2$^{nd}$ area (or size) A1-2 may be less than the 1-1$^{st}$ area (or size) A1-1, and the 1-3$^{rd}$ area (or size) A1-3 may be greater than the 1-1$^{st}$ area (or size) A1-1. By having the color filter layers have the different areas from one another in the three pixels PX1-1, PX1-2, and PX1-3 to emit light in the first wavelength range as described above, pixels including the three pixels PX1-1, PX1-2, and PX1-3, located in one column, may emit light of slightly different brightnesses when the same electrical signals are applied to the pixels. Thus, it is possible to minimize or effectively prevent the phenomenon in which stripes are generated in the columns.

For reference, the 1-2$^{nd}$ area (or size) A1-2 may be about 97% of the 1-1$^{st}$ area (or size) A1-1, and the 1-3$^{rd}$ area (or size) A1-3 may be about 103% of the 1-1$^{st}$ area (or size) A1-1. In this case, the thickness of the 1-2$^{nd}$ color filter layer 412 may be about 95% of the thickness of the 1-1$^{st}$ color filter layer 411, and the thickness of the 1-3$^{rd}$ color filter layer 413 may be about 105% of the thickness of the 1-1$^{st}$ color filter layer 411.

It is possible to reduce the probability of the generation of stripes due to a difference in the quantity of injection between nozzles, by depositing the material for forming an emission layer several times by using different nozzles when forming emission layers corresponding to one pixel. For example, in the first injection of the material, one nozzle may be used to form emission layers, and in the second injection of the material, another nozzle may be used to form the emission layers. However, in this case, manufacturing time for forming the emission layer is drastically increased, because inkjet printing for forming the emission layer of one pixel is performed several times. In the case of the organic light-emitting display apparatus according to an illustrated exemplary embodiment, the emission layers of one pixel may be simultaneously formed by using one nozzle, and thus, the organic light-emitting display apparatus may be rapidly manufactured, and the manufacturing time for forming the emission layers may be reduced. In addition, as described above, the exposed upper surfaces having different areas may be randomly distributed, and thus, the organic light-emitting display apparatus capable of displaying a high-quality image may be realized by minimizing or preventing the stripes in the columns.

As illustrated in FIG. 8, the organic light-emitting display apparatus according to the illustrated exemplary embodiment may further include a 2-1$^{st}$ pixel, a 2-2$^{nd}$ pixel and a 2-3$^{rd}$ pixel. The 2-1$^{st}$ pixel, the 2-2$^{nd}$ pixel, and the 2-3$^{rd}$ pixel may be pixels to emit light of wavelengths in the second wavelength range. The first wavelength range may be a wavelength range including, for example, a red light, and the second wavelength range may be a wavelength range including, for example, a green light. A 2-1$^{st}$ color filter layer 421 and a 2-1$^{st}$ color quantum dot layer 421a may be located in the 2-1$^{st}$ pixel, a 2-2$^{nd}$ color filter layer 422 and a 2-2$^{nd}$ color quantum dot layer 422a may be located in the 2-2$^{nd}$ pixel, and a 2-3$^{rd}$ color filter layer 423 and a 2-3$^{rd}$ color quantum dot layer 423a may be located in the 2-3$^{rd}$ pixel. All of the 2-1$^{st}$ 2-2nd and 2-3$^{rd}$ color filter layers 421, 422, and 423 may transmit light of wavelengths in the second wavelength range. The 2-1$^{st}$, 2-2$^{nd}$, and 2-3$^{rd}$ color quantum dot layers may convert light of a third wavelength range to the light of the second wavelength range.

An upper surface of the 2-1$^{st}$ color filter layer 421 facing away from the substrate 100, may have a 2-1$^{st}$ area (or size) A2-1, and an upper surface of the 2-2$^{nd}$ color filter layer 422 facing away from the substrate 100, may have a 2-2$^{nd}$ area (or size) A2-2. Here, the 2-2$^{nd}$ area (or size) A2-2 may be different from the 2-1$^{st}$ area (or size) A2-1.

When the 2-2$^{nd}$ area (or size) A2-2 and the 2-1$^{st}$ area (or size) A2-1 are different from each other, the 2-1$^{st}$ color filter layer 421 and the 2-2$^{nd}$ color filter layer 422 that are formed by depositing substantially the same amount of materials for forming the color filter layers may have different thicknesses from each other. Consequently, even when the same electrical signals are applied to the 2-1$^{st}$ pixel and the 2-2$^{nd}$ pixel, the 2-1$^{st}$ pixel and the 2-2$^{nd}$ pixel may have different brightnesses. Thus, even when the same nozzle is used to form the 2-1$^{st}$ color filter layer 421 of the 2-1$^{st}$ pixel and the 2-2$^{nd}$ color filter layer 422 of the 2-2$^{nd}$ pixel, the 2-1$^{st}$ pixel and the 2-2$^{nd}$ pixel being in the same column, each of the pixels in the corresponding column may emit light of a slightly different brightness when the same electrical signals are applied to the pixels. As a result, it is possible to minimize or effectively prevent a phenomenon in which stripes are generated in the columns.

Further, the upper surface of the 2-3$^{rd}$ color filter layer 423 which transmits light of a wavelength belonging to the second wavelength range and corresponds to the 2-3$^{rd}$ pixel, the upper surface facing away from the substrate 100, may have a 2-3$^{rd}$ area (or size) A2-3, which is different from the 2-1$^{st}$ area (or size) A2-1 and the 2-2$^{nd}$ area (or size) A2-2. For example, the 2-2$^{nd}$ area (or size) A2-2 may be less than the 2-1$^{st}$ area (or size) A2-1, and the 2-3$^{rd}$ area (or size) A2-3 may be greater than the 2-1$^{st}$ area (or size) A2-1. When the areas of the color filter layers of the three pixels to emit light of the second wavelength range are different from one another as described above, pixels including the three pixels, located in one column, may emit light of slightly different brightnesses when the same electrical signals are applied to the pixels. Thus, it is possible to minimize or effectively prevent the phenomenon in which stripes are generated in the columns.

The ratio of the 1-2$^{nd}$ area (or size) A1-2 to the 1-1$^{st}$ area (or size) A1-1 may be substantially the same as the ratio of the 2-2$^{nd}$ area (or size) A2-2 to the 2-1$^{st}$ area (or size) A2-1. Through this configuration, it is possible to minimize the color imbalance between the light of the wavelengths in the first wavelength range, for example, the red light, and the light of the wavelengths in the second wavelength range, for example, the green light. Likewise, the ratio of the 1-1$^{st}$ area (or size) A1-1 to the 1-3$^{rd}$ area (or size) A1-3 may be substantially the same as a ratio of the 2-1$^{st}$ area (or size) A2-1 to the 2-3$^{rd}$ area (or size) A2-3.

Furthermore, the percentage of increase in the size of the 1-2$^{nd}$ area (or size) A1-2 to the 1-1$^{st}$ area (or size) A1-1 may be substantially the same as the percentage of increase in the size of the 1-1$^{st}$ area (or size) A1-1 to the 1-3$^{rd}$ area (or size)

A1-3. Through this configuration, the brightness deviation in the 1-1$^{st}$ pixel PX1-1, the 1-2$^{nd}$ pixel PX1-2, and the 1-3$^{rd}$ pixel PX1-3, corresponding to one column, may be adjusted to be substantially constant. Thus, the general quality of image display may be improved.

As described so far, in the case of the pixels arranged to be adjacent to each other in an x-axis direction in FIG. 8 among pixels emitting the light having a wavelength belonging to the same wavelength range, the upper surfaces of the color filter layers facing away from the substrate 100, may have different areas (or sizes). Also, in the case of the pixels in y-axis direction among pixels emitting the light having a wavelength belonging to the same wavelength range, the upper surfaces of the color filter layers facing away from the substrate 100, may have different areas. For example, FIG. 8 illustrates that the 1-2$^{nd}$ color filter layer 412 of the 1-2$^{nd}$ pixel PX1-2 located at an upper left side has the 1-2$^{nd}$ area A1-2, and the 1-3$^{rd}$ color filter layer 413 overlapping the 1-3$^{rd}$ pixel PX1-3, has the 1-3$^{rd}$ area A1-3, wherein the 1-3$^{rd}$ pixel PX1-3 is adjacent to the 1-2$^{nd}$ pixel PX1-2 in the y-axis direction among pixels emitting light having a wavelength belonging to the same wavelength range. When a display apparatus has this structure, the general quality of image display may be improved.

According to necessity, it is also possible to allow color filter layers to have different areas (or sizes), also in the case of pixels to emit light of different wavelength ranges in the y-axis direction. For example, FIG. 8 illustrates that the 1-2$^{nd}$ color filter layer 412 of the 1-2$^{nd}$ pixel PX1-2 located at an upper left side has the 1-2$^{nd}$ area (or size) A1-2, and the 2-3$^{rd}$ color filter layer 423 overlapping the 2-3rd pixel which is adjacent to the 1-2$^{nd}$ pixel PX1-2 in the y-axis direction and emits light of a wavelength range which is different from the wavelength range of the 1-2$^{nd}$ pixel PX1-2, has the 2-3$^{rd}$ area (or size) A2-3. Here, the 1-2$^{nd}$ area (or size) A1-2 and the 2-3$^{rd}$ area (or size) A2-3 may be different from each other.

Descriptions have been given with respect to the pixels to emit a red light and located in the columns indicated as R in FIG. 8 and the pixels a green light and located in the columns indicated as G in FIG. 8. However, the descriptions may be applied to pixels to emit a blue light and located in the columns indicated as B in FIG. 8.

A display apparatus according to another exemplary embodiment will be described by referring to FIGS. 7A and 8. The display apparatus according to the illustrated exemplary embodiment may include a plurality of first pixels PX1-1, PX1-2, and PX1-3 and first color filter layers 411, 412, and 413, located on the substrate 100. The first color filter layers 411, 412, and 413 may correspond to the first pixels PX1-1, PX1-2, and PX1-3 and may transmit light of wavelengths in a first wavelength range. Here, one or more of first upper surfaces of the first color filter layers 411, 412, and 413 facing away from the substrate 100, may have a 1-1$^{st}$ area (or size) A1-1, and another or others of the first upper surfaces of the first color filter layers 411, 412, and 413 facing away from the substrate 100, may have a 1-2$^{nd}$ area A1-2, which is different from the 1-1$^{st}$ area A1-1. For example, the 1-2$^{nd}$ area (or size) A1-2 may be less than the 1-1$^{st}$ area (or size) A1-1. In addition, locations of the one or more of the first color filter layers 411, 412, and 413 that have the 1-1$^{st}$ area (or size) A1-1 and locations of the another or others that have the 1-2$^{nd}$ area (or size) A1-2 may be randomly distributed.

The first color filter layers 411, 412, and 413 may be formed by an inkjet printing method. However, the amount of a material injected by each of the nozzles used for the inkjet printing method may not be substantially the same as each other. Ideally, nozzles may be able to inject substantially the same pre-defined quantities of materials. However, in the practical account, there may be errors in the amount of injection. When the amounts of injection of the nozzles are different, the color filter layers may have different thicknesses, and when the color filter layers have different thicknesses, brightnesses of the color filter layers may be different even when the same electrical signals are applied to the color filter layers.

FIG. 3 is a photograph showing a case in which only red pixels emit light in a display apparatus according to the conventional art. Numbers of the horizontal axis and the vertical axis in FIG. 3 are numbers to specify a location of a pixel in a display area. FIG. 3 illustrates the case in which the same electrical signals are applied to the red pixels to allow the red pixels to emit light of substantially the same brightness. However, as shown in FIG. 3, vertical stripes are shown in a red image displayed by the display apparatus.

The vertical stripes are a phenomenon caused by the difference between the thickness of emission layers in one column and the thickness of emission layers in a column adjacent to the one column. The reason for this phenomenon is described above.

However, in the case of the display apparatus according to the illustrated exemplary embodiment, stripes as shown in FIG. 3 are not shown in the photograph of FIG. 4, which indicates the case in which only red pixels emit light. This may be because one or more of the first upper surfaces of the first color filter layers 411, 412, and 413 facing away from the substrate 100, have the 1-1$^{st}$ area (or size) A1-1, and the another or others of the first upper surfaces of the first color filter layers 411, 412, and 413 have the 1-2$^{nd}$ area (or size) A1-2 that is different from the 1-1$^{st}$ area (or size) A1-1, and the locations of the one or more of the first color filter layers 411, 412, and 413 that have the 1-1$^{st}$ area (or size) A1-1 and the locations of the another or others of the first color filter layers 411, 412, and 413 that have the 1-2$^{nd}$ area (or size) A1-2 may be randomly distributed. Thus, according to the display apparatus according to the illustrated exemplary embodiment, stripes may not be generated throughout the display area and high-quality images may be displayed.

One or more of the first upper surfaces of the first color filter layers 411, 412, and 413 facing away from the substrate 100, may have the 1-1$^{st}$ area (or size) A1-1, and another or others of the first upper surfaces of the first color filter layers 411, 412, and 413 facing away from the substrate 100, may have the 1-2$^{nd}$ area (or size) A1-2, which is different from the 1-1$^{st}$ area A1-1. Further, yet another or others of the first upper surfaces of the first color filter layers 411, 412, and 413 facing away from the substrate 100, may have a 1-3$^{rd}$ area (or size) A1-3. Also, in this case, locations of the one or more of the first color filter layers 411, 412, and 413 having the 1-1$^{st}$ area (or size) A1-1, locations of the another or others of the first color filter layers 411, 412, and 413 having the 1-2$^{nd}$ area (or size) A1-2, and locations of yet another or others of the first color filter layers 411, 412, and 413 having the 1-3$^{rd}$ area (or size) A1-3, may be randomly distributed. Thus, stripes may not be generated throughout the display area and a high-quality image may be displayed.

The display apparatus according to the illustrated exemplary embodiment may include a plurality of second pixels located on the substrate 100, and second color filter layers 421, 422, and 423 transmitting light of wavelengths belonging to a second wavelength range and corresponding to the second pixels. The light of the wavelengths in the second wavelength range may be, for example, green light. Here, one or more of second upper surfaces of the second color filter layers 421, 422, and 423 facing away from the substrate 100, may have a 2-$1^{st}$ area (or size) A2-1, and the another or others of the second upper surfaces of the second color filter layers 421, 422, and 423 facing away from the substrate 100, may have a 2-$2^{nd}$ area (or size) A2-2, which is different from the 2-$1^{st}$ area (or size) A2-1. For example, the 2-$2^{nd}$ area (or size) A2-2 may be less than the 2-$1^{st}$ area (or size) A2-1. In addition, locations of the one or more of the second color filter layers 421, 422, and 423 that have the 2-$1^{st}$ area (or size) A2-1 and locations of the another or others of the second color filter layers 421, 422, and 423 that have the 2-$2^{nd}$ area (or size) A2-2 may be randomly distributed. Through this configuration, even when the second color filter layers are formed by an inkjet printing method, unlike the display apparatus according to the conventional art, which generates the stripes as shown in FIG. 5, a high-quality image without stripes as shown in FIG. 6 may be displayed.

One or more of the second upper surfaces of the second color filter layers 421, 422, and 423 facing away from the substrate 100, may have the 2-$1^{st}$ area (or size) A2-1, and another or others of the second upper surfaces of the second color filter layers 421, 422, and 423 facing away from the substrate 100, may have the 2-$2^{nd}$ area (or size) A2-2, which is different from the 2-$1^{st}$ area (or size) A2-1. Further, yet another or others of the second upper surfaces of the second color filter layers 421, 422, and 423 facing away from the substrate 100, may have a 2-$3^{rd}$ area (or size) A2-3. Also, in this case, locations of the one or more of the second color filter layers 421, 422, and 423 having the 2-$1^{st}$ area (or size) A2-1, locations of the another or others of the second color filter layers 421, 422, and 423 having the 2-$2^{nd}$ area (or size) A2-2, and locations of yet another or others of the second color filter layers 421, 422, and 423 having the 2-$3^{rd}$ area (or size) A2-3, may be randomly distributed. Thus, stripes may not be generated throughout the display area and a high-quality image may be displayed.

The ratio of the 1-$2^{nd}$ area (or size) A1-2 to the 1-$1^{st}$ area (or size) A1-1 may be substantially the same as a ratio of the 2-$2^{nd}$ area (or size) A2-2 to the 2-$1^{st}$ area (or size) A2-1. Through this configuration, it is possible to minimize the color imbalance between the light of the wavelengths in the first wavelength range, for example, the red light, and the light of the wavelengths in the second wavelength range, for example, the green light.

The descriptions have been given with respect to the areas of the color filter layers. However, exemplary embodiments are not limited thereto. For example, a 1-$1^{st}$ color quantum dot layer 411a, a 1-$2^{nd}$ color quantum dot layer 412a, and a 1-$3^{rd}$ color quantum dot layer 413a which convert light of the third wavelength range into light of the first wavelength range may also be formed by inkjet printing. Here, the area of a surface of the 1-$1^{st}$ color quantum dot layer 411a facing away from the substrate 100, may be different from the area of a surface of the 1-$2^{nd}$ color quantum dot layer 412a facing away from the substrate 100. Further, the area of a surface of the 1-$3^{rd}$ color quantum dot layer 413a facing away from the substrate 100, may be different from the area of the surface of the 1-$1^{st}$ color quantum dot layer 411a facing away from the substrate 100, and the area of the surface of the 1-$2^{nd}$ color quantum dot layer 412a facing away from the substrate 100. Like this, the described configurations with respect to the color filter layers may also be applied to the quantum dot layers.

According to the one or more of the described embodiments, a display apparatus for displaying a high-quality image may be realized. However, the scope of the invention is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a substrate;
   a 1-$1^{st}$ pixel electrode disposed in a 1-$1^{st}$ pixel to emit light of a wavelength belonging to a first wavelength range and a 1-$2^{nd}$ pixel electrode disposed in a 1-$2^{nd}$ pixel to emit light of a wavelength belonging to the first wavelength range, wherein the 1-$1^{st}$ pixel and the 1-$2^{nd}$ pixel are disposed over the substrate;
   a pixel-defining layer covering an edge of the 1-$1^{st}$ pixel electrode and an edge of the 1-$2^{nd}$ pixel electrode so as to define a 1-$1^{st}$ exposed upper surface including a center of an upper surface of the 1-$1^{st}$ pixel electrode and a 1-$2^{nd}$ exposed upper surface including a center of an upper surface of the 1-$2^{nd}$ pixel electrode such that the 1-$1^{st}$ exposed upper surface has a 1-$1^{st}$ area and the 1-$2^{nd}$ exposed upper surface has a 1-$2^{nd}$ area differing in size from the 1-$1^{st}$ area;
   a 1-$1^{st}$ emission layer over the 1-$1^{st}$ pixel electrode and to generate the light of the wavelength belonging to the first wavelength range and a 1-$2^{nd}$ emission layer over the 1-$2^{nd}$ pixel electrode and to generate the light of the wavelength belonging to the first wavelength range; and
   an opposite electrode over the 1-$1^{st}$ emission layer and the 1-$2^{nd}$ emission layer.

2. The organic light-emitting display apparatus of claim 1, further comprising:
   a 1-$3^{rd}$ pixel electrode disposed in a 1-$3^{rd}$ pixel disposed over the substrate and to emit light of a wavelength belonging to the first wavelength range; and
   a 1-$3^{rd}$ emission layer disposed over the 1-$3^{rd}$ pixel electrode to generate the light of the wavelength belonging to the first wavelength range,
   wherein the opposite electrode is disposed over the 1-$1^{st}$, 1-$2^{nd}$, and 1-$3^{rd}$ emission layers, and
   the pixel-defining layer covers an edge of the 1-$3^{rd}$ pixel electrode so as to define a 1-$3^{rd}$ exposed upper surface including a center of an upper surface of the 1-$3^{rd}$ pixel electrode such that a 1-$3^{rd}$ area of the 1-$3^{rd}$ exposed upper surface differs in size from the 1-$1^{st}$ area and the 1-$2^{nd}$ area.

3. The organic light-emitting display apparatus of claim 2, wherein the 1-$2^{nd}$ area is smaller than 1-$1^{st}$ area, and the 1-$3^{rd}$ area is greater than the 1-$1^{st}$ area.

4. The organic light-emitting display apparatus of claim 1, further comprising:
   a 2-$1^{st}$ pixel electrode disposed in a 2-$1^{st}$ pixel to emit light of a wavelength belonging to a second wavelength range which is different from the first wavelength range, and a 2-$2^{nd}$ pixel electrode disposed in a 2-$2^{nd}$ pixel to emit light of a wavelength belonging to the second wavelength range, wherein the 2-$1^{st}$ pixel and the 2-$2^{nd}$ pixel are disposed over the substrate; and a 2-$1^{st}$ emission layer disposed over the 2-$1^{st}$ pixel electrode to generate the light of the wavelength belonging to the second wavelength range and a 2-$2^{nd}$ emission layer disposed over the 2-$2^{nd}$ pixel electrode to generate the light of the wavelength belonging to the second wavelength range, wherein the opposite electrode is disposed over the 1-$1^{st}$ emission layer, the 1-$2^{nd}$ emission layer, the 2-$1^{st}$ emission layer, and the 2-$2^{nd}$ emission layer, and the pixel-defining layer covers an edge of the 2-$1^{st}$ pixel electrode and an edge of the 2-$2^{nd}$ pixel electrode so as to define a 2-$1^{st}$ exposed upper surface including a center of an upper surface of the 2-$1^{st}$ pixel electrode and a 2-$2^{nd}$ exposed upper surface including a center of an upper surface of the 2-$2^{nd}$ pixel electrode such that a 2-$2^{nd}$ area of the 2-$2^{nd}$ exposed upper surface differs in size from a 2-$1^{st}$ area of the 2-$1^{st}$ exposed upper surface.

5. The organic light-emitting display apparatus of claim 4, wherein a ratio of the size of the 1-$2^{nd}$ area to the 1-$1^{st}$ area is substantially equal to a ratio of the size of the 2-$2^{nd}$ area to the 2-$1^{st}$ area.

6. The organic light-emitting display apparatus of claim 4, further comprising:

a 1-$3^{rd}$ pixel electrode disposed in a 1-$3^{rd}$ pixel disposed over the substrate to emit light of a wavelength belonging to the first wavelength range;

a 1-$3^{rd}$ emission layer disposed over the 1-$3^{rd}$ pixel electrode to generate the light of the wavelength belonging to the first wavelength range;

a 2-$3^{rd}$ pixel electrode disposed in a 2-$3^{rd}$ pixel disposed over the substrate to emit light of a wavelength belonging to the second wavelength range; and a 2-$3^{rd}$ emission layer disposed over the 2-$3^{rd}$ pixel electrode to generate the light of the wavelength belonging to the second wavelength range, wherein the opposite electrode is disposed over the 1-$1^{st}$, 1-$2^{nd}$, and 1-$3^{rd}$ emission layers and the 2-$1^{st}$, 2-$2^{nd}$, and 2-$3^{rd}$ emission layers, and the pixel-defining layer covers an edge of the 1-$3^{rd}$ pixel electrode so as to define a 1-$3^{rd}$ exposed upper surface including a center of an upper surface of the 1-$3^{rd}$ pixel electrode and covers an edge of the 2-$3^{rd}$ pixel electrode so as to define a 2-$3^{rd}$ exposed upper surface including a center of an upper surface of the 2-$3^{rd}$ pixel electrode such that a 1-$3^{rd}$ area of the 1-$3^{rd}$ exposed upper surface differs in size from the 1-$1^{st}$ area and the 1-$2^{nd}$ area and a 2-$3^{rd}$ area of the 2-$3^{rd}$ exposed upper surface differs in size from the 2-$1^{st}$ area and the 2-$2^{nd}$ area.

7. The organic light-emitting display apparatus of claim 6, wherein the 1-$2^{nd}$ area is smaller than the 1-$1^{st}$ area, and the 1-$3^{rd}$ area is greater than the 1-$1^{st}$ area, and the 2-$2^{nd}$ area is smaller than 2-$1^{st}$ area, and the 2-$3^{rd}$ area is greater than the 2-$1^{st}$ area.

8. The organic light-emitting display apparatus of claim 7, wherein a ratio of the 1-$2^{nd}$ area to the 1-$1^{st}$ area is substantially equal to a ratio of the 2-$2^{nd}$ area to the 2-$1^{st}$ area, and a ratio of the 1-$1^{st}$ area to the 1-$3^{rd}$ area is substantially equal to a ratio of the 2-$1^{st}$ area to the 2-$3^{rd}$ area.

9. The organic light-emitting display apparatus of claim 8, wherein the percentage of increase in the size of the 1-$2^{nd}$ area to the 1-$1^{st}$ area is substantially equal to the percentage of increase in the size of the 1-$1^{st}$ area to the 1-$3^{rd}$ area.

10. An organic light-emitting display apparatus comprising:

a substrate;

a plurality of first pixel electrodes disposed in a first column over the substrate;

a pixel-defining layer covering an edge of each of the plurality of first pixel electrodes to define first exposed upper surfaces including centers of upper surfaces of the plurality of first pixel electrodes;

a first emission layer disposed over the plurality of first pixel electrodes and to generate light of a wavelength belonging to a first wavelength range; and an opposite electrode disposed over the first emission layer, wherein one or more of the first exposed upper surfaces have a first area in the first column, and another or others of the first exposed upper surfaces have a second area in the first column, which has a difference in size from the first area.

11. The organic light-emitting display apparatus of claim 10, wherein locations of the one or more of the first exposed upper surfaces having the first area, and locations of the another or others of the first exposed upper surfaces having the second area, are randomly distributed.

12. The organic light-emitting display apparatus of claim 10, wherein another or others of the first exposed upper surfaces have a third area in the first column, which has a difference in size from the first area and the second area.

13. The organic light-emitting display apparatus of claim 12, wherein locations of the one or more of the first exposed upper surfaces having the first area, locations of the another or others of the first exposed upper surfaces having the second area, and locations of the yet another or others of the first exposed upper surfaces having the third area, are randomly distributed.

14. The organic light-emitting display apparatus of claim 10, further comprising:

a plurality of second pixel electrodes disposed in a second column over the substrate; and a second emission layer disposed over the plurality of second pixel electrodes and to generate light of a wavelength belonging to a second wavelength range, wherein the pixel-defining layer covers an edge of each of the plurality of second pixel electrodes to define second exposed upper surfaces including centers of upper surfaces of the plurality of second pixel electrodes, the opposite electrode is disposed over the second emission layer, and one or more of the second exposed upper surfaces have a fourth area in the second column and another or others of the second exposed upper surfaces have a fifth area in the second column, which has a difference in size from the fourth area.

15. The organic light-emitting display apparatus of claim 14, wherein locations of the one or more of the second exposed upper surfaces having the fourth area in the second column, and locations of the another or others of the second exposed upper surfaces having the fifth area in the second column, are randomly distributed.

16. The organic light-emitting display apparatus of claim 14, wherein another or others of the second exposed upper surfaces have a sixth area in the second column, which has a difference in size from the fourth area and the fifth area.

17. The organic light-emitting display apparatus of claim 16, wherein, locations of the one or more of the second exposed upper surfaces having the fourth area, locations of the another or others of the second exposed upper surfaces having the fifth area, and locations of the yet another or others of the second exposed upper surfaces having the sixth area, are randomly distributed.

18. The organic light-emitting display apparatus of claim 16, wherein the second area is smaller than the first area, and the fifth area is smaller than the fourth area.

19. The organic light-emitting display apparatus of claim 18, wherein a ratio of the size of the second area to the first area is substantially equal to a ratio of the size of the fifth area to the fourth area.

20. A display apparatus comprising:
a substrate;
a $1\text{-}1^{st}$ pixel and a $1\text{-}2^{nd}$ pixel disposed over the substrate; and
a $1\text{-}1^{st}$ color filter layer and a $1\text{-}2^{nd}$ color filter layer, wherein the $1\text{-}1^{st}$ color filter layer is configured to transmit light of a wavelength belonging to a first wavelength range, overlaps the $1\text{-}1^{st}$ pixel, and has an upper surface having a $1\text{-}1^{st}$ area, the upper surface of the $1\text{-}1^{st}$ color filter layer facing away from the substrate, and the $1\text{-}2^{nd}$ color filter layer is configured to transmit light of a wavelength belonging to the first wavelength range, overlaps the $1\text{-}2^{nd}$ pixel, and has an upper surface having a $1\text{-}2^{nd}$ area, which has a difference in size from the $1\text{-}1^{st}$ area, the upper surface of the $1\text{-}2^{nd}$ color filter layer facing away from the substrate.

21. The display apparatus of claim 20, further comprising:
a $1\text{-}3^{rd}$ pixel disposed over the substrate; and
a $1\text{-}3^{rd}$ color filter layer to transmit light of a wavelength belonging to the first wavelength range, overlapping the $1\text{-}3^{rd}$ pixel, and having an upper surface having a $1\text{-}3^{rd}$ area, which has a difference in size from the $1\text{-}1^{st}$ area and the $1\text{-}2^{nd}$ area, the upper surface of the $1\text{-}3^{rd}$ color filter layer facing away from the substrate.

22. The display apparatus of claim 21, wherein the $1\text{-}2^{nd}$ area is smaller than the $1\text{-}1^{st}$ area, and the $1\text{-}3^{rd}$ area is greater than the $1\text{-}1^{st}$ area.

23. The display apparatus of claim 20, further comprising:
a $2\text{-}1^{st}$ pixel and a $2\text{-}2^{nd}$ pixel disposed over the substrate; and
a $2\text{-}1^{st}$ color filter layer and a $2\text{-}2^{nd}$ color filter layer, wherein the $2\text{-}1^{st}$ color filter layer is configured to transmit light of a wavelength belonging to a second wavelength range that is different from the first wavelength range, corresponds to the $2\text{-}1^{st}$ pixel, and has an upper surface having a $2\text{-}1^{st}$ area, the upper surface of the $2\text{-}1^{st}$ color filter layer facing away from the substrate, and the $2\text{-}2^{nd}$ color filter layer is configured to transmit light of a wavelength belonging to the second wavelength range, corresponds to the $2\text{-}2^{nd}$ pixel, and has an upper surface having a $2\text{-}2^{nd}$ area, which has a difference in size from the $2\text{-}1^{st}$ area, the upper surface of the $2\text{-}2^{nd}$ color filter layer facing away from the substrate.

24. The display apparatus of claim 23, wherein a ratio of the difference in size of the $1\text{-}2^{nd}$ area to the $1\text{-}1^{st}$ area is substantially equal to a ratio of the difference in size of the $2\text{-}2^{nd}$ area to the $2\text{-}1^{st}$ area.

25. The display apparatus of claim 23, further comprising:
a $1\text{-}3^{rd}$ pixel and a $2\text{-}3^{rd}$ pixel disposed over the substrate;
a $1\text{-}3^{rd}$ color filter layer to transmit light of a wavelength belonging to the first wavelength range, overlapping the $1\text{-}3^{rd}$ pixel, and having an upper surface having a $1\text{-}3^{rd}$ area which has a difference in size from the $1\text{-}1^{st}$ area and the $1\text{-}2^{nd}$ area, the upper surface of the $1\text{-}3^{rd}$ color filter layer facing away from the substrate; and
a $2\text{-}3^{rd}$ color filter layer to transmit light of a wavelength belonging to the second wavelength range, overlapping the $2\text{-}3^{rd}$ pixel, and having an upper surface having a $2\text{-}3^{rd}$ area which has a difference in size from the $2\text{-}1^{st}$ area and the $2\text{-}2^{nd}$ area, the upper surface of the $2\text{-}3^{rd}$ color filter layer facing away from the substrate.

26. The display apparatus of claim 25, wherein the $1\text{-}2^{nd}$ area is smaller than the $1\text{-}1^{st}$ area, and the $1\text{-}3^{rd}$ area is greater than the $1\text{-}1^{st}$ area, and
the $2\text{-}2^{nd}$ area is smaller than the $2\text{-}1^{st}$ area, and the $2\text{-}3^{rd}$ area is greater than the $2\text{-}1^{st}$ area.

27. The display apparatus of claim 26, wherein a ratio of the size of the $1\text{-}2^{nd}$ area to the $1\text{-}1^{st}$ area is substantially equal to a ratio of the $2\text{-}2^{nd}$ area to the $2\text{-}1^{st}$ area, and a ratio of the size of the $1\text{-}1^{st}$ area to the $1\text{-}3^{rd}$ area is substantially equal to a ratio of the $2\text{-}1^{st}$ area to the $2\text{-}3^{rd}$ area.

28. The display apparatus of claim 27, wherein the percentage of increase in the size of the $1\text{-}2^{nd}$ area to the $1\text{-}1^{st}$ area is substantially equal to the percentage of increase in the size of the $1\text{-}1^{st}$ area to the $1\text{-}3^{rd}$ area.

29. A display apparatus comprising:
a substrate;
a plurality of first pixels disposed in a first column over the substrate; and
first color filter layers to transmit light of wavelengths belonging to a first wavelength range and overlapping the first pixels,
wherein one or more of first upper surfaces of the first color filter layers have a first area in the first column, and another or others of the first upper surfaces of the first color filter layers have a second area in the first column, which has a difference in size from the first area, the first upper surfaces facing away from the substrate.

30. The display apparatus of claim 29, wherein locations of the one or more of the first upper surfaces having the first area, and locations of the another or others of the first upper surfaces having the second area, are randomly distributed.

31. The display apparatus of claim 29, wherein another or others of the first upper surfaces have a third area in the first column, which has a difference in size from the first area and the second area.

32. The display apparatus of claim 31, wherein locations of the one or more of the first upper surfaces having the first area, locations of the another or others of the first upper surfaces having the second area, and locations of the yet another or others of the first upper surfaces having the third area, are randomly distributed.

33. The display apparatus of claim 29, further comprising:
a plurality of second pixels disposed in a second column over the substrate; and
second color filters to transmit light of a wavelength belonging to a second wavelength range, which has a difference in size from the first wavelength range, and overlapping the second pixels,
wherein one or more of second upper surfaces of the second color filter layers facing away from the substrate have a fourth area in the second column, and another or others of the second upper surfaces of the second color filter layers have a fifth area in the second column, which has a difference in size from the fourth area.

34. The display apparatus of claim 33, wherein locations of the one or more of the second upper surfaces having the fourth area, and locations of the another or others of the second upper surfaces having the fifth area, are randomly distributed.

35. The display apparatus of claim 33, wherein another or others of the second upper surfaces have a sixth area in the second column, which has a difference in size from the fourth area and the fifth area.

36. The display apparatus of claim 35, wherein locations of the one or more of the second upper surfaces having the fourth area, locations of the another or others of the second upper surfaces having the fifth area, and locations of the yet another or others of the second upper surfaces having the sixth area, are randomly distributed.

37. The display apparatus of claim 33, wherein the second area is smaller than the first area, and the fifth area is smaller than the fourth area.

38. The display apparatus of claim 37, wherein a ratio of the size of the second area to the first area is substantially equal to a ratio of the size of the fifth area to the fourth area.

* * * * *